(12) United States Patent
Kim et al.

(10) Patent No.: US 8,031,813 B2
(45) Date of Patent: Oct. 4, 2011

(54) VSB RECEIVER AND CARRIER RECOVERY APPARATUS THEREOF

(75) Inventors: Joon Tae Kim, Gyeonggi-do (KR); Tok Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 196 days.

(21) Appl. No.: 12/478,613

(22) Filed: Jun. 4, 2009

(65) Prior Publication Data

US 2009/0245390 A1 Oct. 1, 2009

Related U.S. Application Data

(62) Division of application No. 11/002,874, filed on Dec. 1, 2004, now Pat. No. 7,558,340.

(30) Foreign Application Priority Data

Dec. 1, 2003 (KR) .................. 10-2003-0086336
Dec. 22, 2003 (KR) .................. 10-2003-0094592

(51) Int. Cl.
*H04L 27/14* (2006.01)
*H04L 27/06* (2006.01)

(52) U.S. Cl. ....................... 375/326; 375/344

(58) Field of Classification Search ........... 375/134, 375/137, 145, 149, 260, 326, 344
See application file for complete search history.

(56) References Cited

U.S. PATENT DOCUMENTS

| | | | |
|---|---|---|---|
| 5,471,508 A * | 11/1995 | Koslov | 375/344 |
| 5,905,405 A * | 5/1999 | Ishizawa | 329/308 |
| 6,356,598 B1 | 3/2002 | Wang | |
| 6,404,825 B1 * | 6/2002 | Efstathiou | 375/326 |
| 6,697,098 B1 | 2/2004 | Wang | |
| 6,904,098 B1 * | 6/2005 | Isaksen et al. | 375/261 |
| 6,985,192 B1 | 1/2006 | Bouillet et al. | |
| 7,061,996 B2 | 6/2006 | Kim | |
| 7,251,295 B2 * | 7/2007 | Jun | 375/326 |
| 2003/0161414 A1 | 8/2003 | Jun | |
| 2004/0067039 A1 | 4/2004 | Jun | |
| 2004/0114675 A1 | 6/2004 | Crawford | |
| 2004/0136474 A1 * | 7/2004 | Hwang | 375/326 |
| 2004/0165682 A1 * | 8/2004 | Jun | 375/326 |

FOREIGN PATENT DOCUMENTS

| | | |
|---|---|---|
| KR | 10-0153604 | 12/1998 |
| KR | 10-2001-0018409 | 3/2001 |

* cited by examiner

*Primary Examiner* — Young T. Tse
(74) *Attorney, Agent, or Firm* — Lee, Hong, Degerman, Kang & Waimey

(57) ABSTRACT

There are provided a VSB receiver and a carrier recovery apparatus thereof, in which a carrier is recovered using a VSB modulated signal. In the VSB receiver, a digital processing part selects a desired channel frequency through an antenna, converts the channel frequency into an intermediate frequency, and digitalizes the channel frequency by passing a predetermined band of the intermediate frequency. A carrier recovery part extracts pilot signals by using a first LPF having a first bandwidth and a second LPF having a second bandwidth, and recovers a baseband carrier wave signal from a passband signal by using one of the extracted pilot signals. A clock demodulation part removes the pilot signal from the baseband carrier wave signal and extracts a synchronizing signal. A noise removing part removes a linear noise and a residual phase jitter of the baseband signal by using the synchronizing signal. A decoding part decodes the baseband signal whose noise is removed. Accordingly, the carrier recovery can be stably performed even when the pilot signal is weak.

5 Claims, 15 Drawing Sheets

VSB RECEIVER AND CARRIER RECOVERY APPARATUS THEREOF

This application is a divisional of U.S. application Ser. No. 11/002,874, filed Dec. 1, 2004, now U.S. Pat. No. 7,558,340, which pursuant to 35 U.S.C. §119(a) claims the benefit of the Korean Application Nos. 10-2003-0086336, filed on Dec. 1, 2003, and 10-2003-0094592, filed on Dec. 22, 2003 which are hereby incorporated by reference.

BACKGROUND OF THE INVENTION

1. Field of the Invention

The present invention relates to a digital TV, and more particularly, to a VSB receiver and a carrier recovery apparatus thereof, in which a carrier is recovered using a VSB modulated signal.

2. Discussion of the Related Art

A vestigial sideband (VSB) system of Grand Alliance is adopted as the standard for a transmission system of digital TV (e.g., HDTV) in the United States and Korea. In the VSB system, when a signal is amplitude-modulated, upper and lower sidebands are generated based on a carrier wave. At this point, when one of the two sidebands is greatly reduced, the other sideband is modulated. That is, only one sideband spectrum of a baseband signal is removed to a passband and then transmitted, such that the VSB modulation is more efficient in the use of bandwidth.

In the VSB modulation, if a DC spectrum of a baseband signal is removed to a passband, the DC spectrum is converted to a tone spectrum. This signal is called a pilot signal. That is, when a broadcasting station performs the VSB modulation, the pilot signal is carried and transmitted together via air so that a receiver can correctly demodulate the signal.

FIG. 1 is a schematic block diagram of a general digital TV transmitter. Referring to FIG. 1, a randomizer 101 randomly outputs an input data to a Read-Solomon (RS) encoder 102. The RS encoder 102 performs an RS encoding of the randomly inputted data for inner and outer channel coding and adds a parity code of 20 bytes to outputs the resulting signal to an interleaver 103.

The interleaver 103 interleaves the RS encoded data according to a preset regulation and outputs the interleaved data to a trellis encoder 104. The trellis encoder 104 converts the interleaved data into a symbol in byte for a trellis coding and outputs it to a multiplexer 105.

The multiplexer 105 performs a multiplexing of a segment synchronizing signal and a field synchronizing signal to a trellis coded symbol sequence per segment and frame to thereby form a frame, and then outputs the frame to a pilot insertion part 106. The pilot insertion part 106 inserts a pilot signal of a DC value into the framed transmission symbol and outputs to a VSB modulation part 107.

The VSB modulation part 107 modulates the symbol sequence having the pilot signal inserted thereinto in the VSB system and outputs the modulated symbol sequence to an RF up-converter 108. The RF up-converter 108 converts the VSB signal of the modulated baseband into an RF passband signal so as to effectively transmit the signal via an antenna.

FIG. 2 is a block diagram of the VSB modulation part of the digital TV transmitter shown in FIG. 1.

Referring to FIG. 2, a channel encoder 201 is configured with the randomizer 101, the RS encoder 102, the interleaver 103, the trellis encoder 104, the multiplexer 105, the pilot insertion part 106, and the VSB modulation part 107 includes a complex filter 202 and an intermediate frequency (IF) modulator 203. A signal passes through the channel encoder 201 and the VSB modulation part 107. First, for the VSB modulation, the signal passing through the channel encoder 201 passes through the complex filter 202. At this point, if the encoded digital signal passes through the complex filter 202, a Hilbert transformer and an SRC transforms the shapes of frequencies of I and Q signals such that the I and Q signals can be VSB-modulated.

The I and Q signals as the output of the complex filter 202 are IF-modulated at the IF modulator 203 and then subtracted at a subtracter 204, resulting in a VSB IF signal of a required bandwidth (6 MHz). In order to transmit the VSB IF signal via radio wave, the VSB IF signal is converted into an RF passband signal by the RF up-converter 205 and the RF baseband signal is transmitted via the antenna.

FIG. 3 is a block diagram of a general digital TV receiver based on the ATSC standard.

In the digital TV receiver, a passband signal of a specific channel is extracted by a tuner 302 and a carrier wave is recovered using a pilot signal inserted into a sideband. Then, a transmission symbol is extracted from the recovered baseband signal by a symbol timing recovery and a channel compensation.

Referring to FIG. 3, the digital TV receiver includes: a tuner 302 for selecting a desired channel frequency from the RF signal received through an antenna 301 and primarily converting the VSB signal from the RF band to an IF band; a surface acoustic wave (SAW) filter 303 for passing a predetermined band of the IF signal output from the tuner 302; an IF processing part 304 for secondarily converting an output signal of the tuner 302 into an analog signal; an analog-to-digital converter (ADC) 305 for converting the analog signal into a digital signal; a carrier recovery part 306 for converting the digital signal into a baseband signal; a DC limiter 307 for removing a pilot signal from an output signal of the carrier recovery part 306; a synchronizing part 308 for extracting a synchronizing signal from an output signal of the DC limiter 307 and recovering a symbol timing; a channel equalizer 309 for removing linear noise from the signal whose DC component is removed; a phase tracking part 310 for removing residual phase jitter from the signal whose linear noise is removed; and an FEC part 311 for decoding the signal, which is an operation opposite to the digital channel coding of the transmitter.

The tuner 302, the SAW filter 303 and the IF processing part 304 can be called an analog processing part, and the ADC 305 and the analog processing part can be called a digital processing part. Also, the DC limiter 307 and the synchronizing part 308 can be called a clock demodulation part 312, and the channel equalizer 309 and the phase tracking part 310 can be called a noise removing part 313.

That is, if a VBS-modulated RF signal is received through the antenna 301, the tuner 302 selects a desired channel frequency by using a heterodyne modulation system and then the VSB signal of the RF band carried on the channel frequency is lowered to a fixed IF band (generally, 44 MHz or 43.75 MHz) and signals of the other channels are properly filtered.

An output signal of the tuner 302 passes through the SAW filter 303, which removes signals of undesired bands and noise signals and serves as an analog matching filter.

For example, a digital broadcasting signal has all information within a band from the IF band of 44 MHz to a frequency band of 6 MHz, so that the SAW filter 303 removes all sections from the output signal of the tuner 302, except the band of 6 MHz in which information exists, and then outputs the remaining band signal to the IF processing part 304.

The IF processing part 304 converts the signal into an analog signal, and the ADC 305 converts the analog signal into a digital signal.

The passband signal converted into the digital signal is demodulated into a baseband signal by the carrier recovery part 306. In the baseband signal, a frequency of the pilot signal inserted for the carrier demodulation at the transmitter changes to 0 Hz, which is a DC component.

Since the DC component finished its role, the DC component is removed by the DC limiter 307.

Information of a synchronizing signal section is extracted by the synchronizing part 308. The information of the synchronizing signal section is used in the channel equalizer 309, the phase tracking part 310 and the FEC part 311.

The signal whose DC component is removed passes through the channel equalizer 309 to remove linear noises existing in the transport channel and the analog processing part of the receiver. Then, the signal passes through the phase tracking part 310 for removing the residual phase jitter and then it is decoded by the FEC part 311. If this process is finished, the digital TV receiver completes its function, and the transport stream equal to the signal inputted from the transmitter to the receiver is transmitted to a video/audio signal processing part (not shown).

FIG. 4 is a block diagram of the carrier recovery part of the digital TV receiver shown in FIG. 3.

In FIG. 4, the carrier recovery part 306 is implemented with a frequency phase locked loop (FPLL) proposed in the ATSC standard.

Referring to FIG. 4, if the passband analog signal is converted into the digital signal, a Hilbert transformer 402 shifts the signal by 90° such that the digital signal is transformed into a Q signal of an imaginary component. A delay unit 401 delays the digital signal by a predetermined time when the digital signal is transformed into the Q signal at the Hilbert transformer 402, and then outputs an I signal of a real component. A complex multiplier 403 multiplies the I and Q signals by an output signal of a voltage controlled oscillator (VCO) 410 to output a baseband I signal and a baseband Q signal. An FPLL includes a frequency locked loop (FLL) and a phase locked loop (PLL). The FLL includes an I signal low pass filter (LPF) 404, a delay unit 406, a code detector 407, a multiplier 408, a loop filter 409, and a VCO (or a numerically controlled oscillator (NCO)) 410. The FLL locks a frequency of the baseband I signal output from the complex multiplier 403. The PLL includes a Q signal LPF 405, the multiplexer 408, the loop filter 409 and the VCO 410. The PLL locks a frequency of the baseband Q signal output from the complex multiplier 403.

The I signal LPF 404, the delay unit 406 and the code detector 407 detect a frequency error, and the Q signal LPF 405 detects a phase error from the detected frequency error. Then, the multiplier 408 multiplies the frequency error and the phase error in order to obtain final frequency and phase error components (the controlled voltage).

The loop filter 409 removes RF components from the frequency and phase error components, and the VCO 410 converts an oscillation frequency according to the frequency and phase error components (the controlled voltage).

That is, the loop filter 409 filters only the baseband signal and the VCO 410 outputs the oscillation frequency varying according to the output signal of the loop filter 409. A beat frequency is removed by changing the frequency and phase of the carrier wave according to the varied oscillation frequency outputted from the VCO 410.

In the carrier recovery part 306, the I signal and the Q signal are demodulated and the frequency and phase are locked by separating the phase from the output signal of the SAW filter 303. Here, the center frequency of the VCO 410 is fixed to an intermediate frequency (for example, 46.690559 MHz) and the complex multiplier 403 multiplies the output of the VCO 410 and the output of the SAW filter 303 to thereby generate a baseband I channel signal i(t) and a baseband Q channel signal q(t).

At this point, the receiver can operate normally when the frequency of the pilot signal accurately is at the intermediate frequency (for example, 46.690559 MHz) at the output of the SAW filter 303. However, in many cases, the frequency of the pilot signal is not 46.690559 MHz.

Meanwhile, the output frequency of the VCO 410 is fixed to 46.690559 MHz. Thus, when the output frequency of the pilot signal is not 46.690559 MHz, there exists a beat frequency corresponding to a difference of two frequencies outputted from the complex multiplier 403. The FPLL is used to remove the beat frequency. That is, the frequency and phase of the carrier wave are changed due to the variation in the oscillation frequency of the VCO 410 and thus the beat frequency is removed. Accordingly, an object of the FPLL is to find a direction and magnitude of the movement of the oscillation frequency of the VCO 410.

The FPLL has a combination of a frequency locking look and a phase locking loop.

In FIG. 4, the frequency locking loop is configured with an auto frequency control filter (AFC), the code detector 407, the multiplier 408, the loop filter 409, the VCO 410 and the complex multiplier 403, and the phase locking loop is configured with the LPF 405, the multiplier 408, the loop filter 409, the VCO 410 and the complex multiplier 403.

FIGS. 5A to 5C are diagrams explaining a characteristic of the output signal of the complex multiplier and FIGS. 6A to 6C are diagrams explaining another characteristic of the output signal of the complex multiplier.

FIG. 5A shows a spectrum characteristic of the baseband I signal when the pilot signal is stably received, and FIGS. 5B and 5C show spectrum characteristics when the pilot signal component gets weaker while passing through the channel and therefore its position cannot be correctly found on the spectrum.

In the case of the FPLL that is dependent on the pilot, data component except the pilot component does not provide information necessary for the carrier recovery and also causes a jitter due to data after the carrier recovery. For these reasons, as shown in FIG. 4, the LPF is used to extract the pilot component from the received data.

When the pilot signal is weak due to the channel, it is preferable to use an LPF having a narrow bandwidth to extract the pilot signal from the data. However, if a carrier frequency offset exists due to the channel in such a state that the pilot signal is not weak, it is preferable to use an LPF having a wide bandwidth, as shown in FIGS. 5B and 5C. Meanwhile, if the component of the pilot signal is severely weak, even the LPF having the wide bandwidth cannot easily extract the pilot component.

FIG. 6A shows a spectrum characteristic of the baseband I signal when the pilot signal is stably received, and FIGS. 6B and 6C shows spectrum characteristics when the frequency offset exists in such a state that the power of the pilot signal is not weak and thus its position cannot be correctly found on the spectrum. As shown in FIGS. 6A to 6C, in case where the LPF having a narrow bandwidth is used, if the pilot signal is out of the narrow bandwidth, it is difficult to extract the pilot component.

According to the prior art, as described above, the LPF having the wide bandwidth is used to extract the pilot signal.

Thus, when the frequency offset exists, no problem occurs. However, if the pilot signal is damaged due to the channel, power of the I signal from the complex multiplier becomes very weak near the DC. Therefore, in the system which performs the carrier recovery based on the pilot signal, its performance is degraded and thus the carrier cannot be recovered. If the LPF having the narrow bandwidth is simply used to extract the pilot signal, it is impossible to solve the problems occurring when the carrier frequency offset exists.

SUMMARY OF THE INVENTION

Accordingly, the present invention is directed to a VSB receiver and a carrier recovery apparatus thereof that substantially obviates one or more problems due to limitations and disadvantages of the related art.

An object of the present invention is to provide a VSB receiver and a carrier recovery apparatus thereof, in which a pilot signal component can be easily extracted by automatically controlling a bandwidth of a filter for filtering a pilot signal component passing through a transmission channel when a carrier wave is recovered using a VSB modulated signal.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a VSB (vestigial sideband) receiver for use in a digital TV receiver for demodulating a passband analog signal into a baseband digital signal, the VSB receiver including: a digital processing part for selecting a desired channel frequency through an antenna, converting the channel frequency into an intermediate frequency, and digitalizing the channel frequency by passing a predetermined band of the intermediate frequency; a carrier recovery part for extracting pilot signals by using a first LPF having a first bandwidth and a second LPF having a second bandwidth, and recovering a baseband carrier wave signal from a passband signal by using one of the extracted pilot signals; a clock demodulation part for removing the pilot signal from the baseband carrier wave signal and extracting a synchronizing signal; a noise removing part for removing a linear noise and a residual phase jitter of the baseband signal by using the synchronizing signal; and a decoding part for decoding the baseband signal whose noise is removed.

The carrier recovery part may further include: a comparator for comparing powers of pilot components passing through the first and second LPFs; a selector for selecting one of the pilot components extracted from the first and second LPFs according to the comparison result of the comparator.

The comparator compares a first threshold value (lock1) and a second threshold value (lock2), the first threshold value (lock1) being generated from a first carrier recovery part using the first LPF, the second threshold value (lock2) being generated from a second carrier recovery part using the second LPF.

The present invention provides a carrier recovery apparatus including: a complex multiplier for multiplying a digitalized passband signal by an oscillation frequency of an oscillator and outputting a recovered carrier wave of a baseband signal; a first band pilot signal and frequency/phase error detecting part for outputting a pilot signal component and a frequency/phase error component of a first bandwidth, the first bandwidth being a bandwidth of an LPF for extracting a typical pilot signal contained in the baseband signal outputted from the complex multiplier; a second band pilot signal and frequency/phase error detecting part for outputting a pilot signal component and a frequency/phase error component of a second bandwidth among the baseband signals outputted from the complex multiplier, the second bandwidth being narrower than the first bandwidth; a comparing part for comparing the pilot signal components outputted from the first and second band pilot signal and frequency/phase error detecting parts, and outputting a selection signal for selecting one of output results of the first and second pilot signal and frequency/phase detecting parts; a selecting part for selecting one of the frequency/phase error components outputted from the first and second band pilot signal and frequency/phase error detecting parts, based on the selection signal of the comparing part; a loop filter for removing an RF component contained in the selected frequency/phase error component; and an oscillator for changing an oscillation frequency according to the frequency/phase error component whose RF component is removed.

The first band pilot signal and frequency/phase error detecting part may include: a first LPF, a first delay unit and a first code detector, which are configured to form a loop for receiving a baseband I signal from the complex multiplier and detecting the pilot signal component and the frequency error component of the first bandwidth; a second LPF configured to form a loop for receiving a baseband Q signal from the complex multiplier and detecting a phase error of the first bandwidth; a first multiplier for multiplying the frequency error by the phase error and detecting a frequency/phase error; and a first integrator for accumulating power of the pilot signal component outputted from the first code detector, and generating a lock signal to the comparing part if the accumulated power of the pilot signal component reaches a preset pilot power threshold value, wherein the second band pilot signal and frequency/phase error detecting part includes: a first LPF, a second delay unit and a second code detector, which are configured to form a loop for receiving the baseband I signal from the complex multiplier and detecting the pilot signal component and the frequency error component of the second bandwidth; a second LPF configured to form a loop for receiving the baseband Q signal from the complex multiplier and detecting a phase error of the second bandwidth; a second multiplier for multiplying the frequency error by the phase error and detecting a frequency/phase error; and a second integrator for accumulating power of the pilot signal component outputted from the second code detector, and generating a lock signal to the comparing part if the accumulated power of the pilot signal component reaches a preset pilot power threshold value.

The pilot power threshold value of the first integrator is greater than that of the second integrator.

The comparing part compares a new first threshold value (lock1) generated from the first band pilot signal and frequency/phase error detecting part with a new second threshold value (lock2) generated from the second band pilot signal and frequency/phase error detecting part, and outputs the selection signal for selecting one of the output results of the first and second pilot signal and frequency/phase detecting parts.

The comparing part generates the selection signal for selecting the output result of the first frequency/phase error detecting part if the first threshold value (lock1) is activated earlier than the second threshold value (lock2), and the comparing part generates the selection signal for selecting the output result of the second frequency/phase error detecting part if the second threshold value (lock2) is activated earlier than the first threshold value (lock1).

The present invention provides a carrier recovery apparatus including: a complex multiplier for multiplying a digitalized passband signal by an oscillation frequency of an oscillator and outputting a recovered carrier wave of a baseband signal; a first frequency/phase error detecting part for outputting a frequency/phase error component of a first bandwidth, the first bandwidth being a bandwidth of an LPF for extracting a typical pilot signal contained in the baseband signal outputted from the complex multiplier; a second frequency/phase error detecting part for outputting a frequency/phase error component of a second bandwidth among the baseband signals outputted from the complex multiplier, the second bandwidth being narrower than the first bandwidth; a pilot power comparing part for comparing a pilot power of the baseband signal with a preset threshold value and outputting a selection signal for selecting one of output results of the first and second frequency/phase detecting parts; a selecting part for selecting one of the frequency/phase error components outputted from the first and second frequency/phase error detecting parts, based on the selection signal of the comparing part; a loop filter for removing an RF component contained in the selected frequency/phase error component; and an oscillator for changing an oscillation frequency according to the frequency/phase error component whose RF component is removed.

The first frequency/phase error detecting part includes: a first LPF, a first delay unit and a first code detector, which are configured to form a loop for receiving a baseband I signal from the complex multiplier and detecting the frequency error component of the first bandwidth; a second LPF configured to form a loop for receiving a baseband Q signal from the complex multiplier and detecting a phase error of the first bandwidth; and a first multiplier for multiplying the frequency error by the phase error and detecting a frequency/phase error, wherein the second frequency/phase error detecting part includes: a first LPF, a second delay unit and a second code detector, which are configured to form a loop for receiving the baseband I signal from the complex multiplier and detecting the frequency error component of the second bandwidth; a second LPF configured to form a loop for receiving the baseband Q signal from the complex multiplier and detecting a phase error of the second bandwidth; and a second multiplier for multiplying the frequency error by the phase error and detecting a frequency/phase error.

The pilot power comparing part includes: an LPF for filtering a pilot signal from the baseband I signal outputted from the complex multiplier; a power calculator for calculating a power of the filtered pilot signal; and a comparator for comparing the power of the filtered pilot signal with a preset threshold value and generating a control signal for selecting one of the output results of the first and second frequency/phase error detecting parts.

The comparator generates the control signal for selecting the output result of the first frequency/phase error detecting part if the power of the pilot signal is greater than a preset threshold value, and the comparator generates the control signal for selecting the output result of the second frequency/phase error detecting part if the power of the pilot signal is less than the preset threshold value.

The pilot power comparing part compares a new first threshold value (lock1) generated from the first frequency/phase error detecting part with a new second threshold value (lock2) generated from the second frequency/phase error detecting part, and outputs the selection signal for selecting one of the output results of the first and second pilot signal and frequency/phase detecting parts.

The present invention provides a carrier recovery apparatus including: a complex multiplier for multiplying a digitalized passband signal by an oscillation frequency of an oscillator and outputting a recovered carrier wave of a baseband signal; a first band signal filtering part for outputting I and Q signal components of a first bandwidth, the first bandwidth being a bandwidth of an LPF for extracting a typical pilot signal contained in the baseband signal outputted from the complex multiplier; a second band signal filtering part for outputting I and Q signal components of a second bandwidth among the baseband signals outputted from the complex multiplier, the second bandwidth being narrower than the first bandwidth; a selecting part for receiving the I and Q signal components from the first and second band signal filtering parts and selecting one I and Q signal component among the I and Q signal components outputted from the first and second band signal filtering parts; a power calculating part for calculating a pilot signal power of a baseband I signal passing through the first band signal filtering part, the baseband I signal being outputted from the selecting part; a comparing part for comparing the calculated pilot signal power with a preset threshold value and generating a control signal for selecting the I and Q signal components outputted from one of the first and second band signal filtering parts; a frequency/phase error detecting part for detecting a frequency/phase error component of the I and Q signals outputted from the selecting part; a loop filter for removing an RF component contained in the frequency/phase error component outputted from the frequency/phase error detecting part; and an oscillator for changing an oscillation frequency according to the frequency/phase error component whose RF component is removed.

The frequency/phase error detecting part includes: a delay unit and a code detector for detecting a frequency error of the I signal from the I and Q signals outputted from the selecting part; and a multiplier for multiplying the frequency error outputted from the code detector by the phase error contained in the Q signal, and outputting a frequency/phase error.

The present invention provides a VSB (vestigial sideband) receiver for use in a digital TV receiver for demodulating a passband analog signal into a baseband digital signal, the VSB receiver including: a digital processing part for selecting a desired channel frequency through an antenna, converting the channel frequency into an intermediate frequency, and digitalizing the channel frequency by passing a predetermined band of the intermediate frequency; a carrier recovery part for comparing a power value of an output signal of an LPF, which removes a signal unnecessary for a carrier recovery among the digitalized passband signals, with a preset reference or threshold value, and recovering a baseband carrier wave by changing power of a pilot component of the digitalized passband signal according to the comparison result; a clock demodulation part for removing the pilot signal from the baseband signal and extracting a synchronizing signal; a noise removing part for removing a linear noise and a residual phase jitter of the baseband signal by using the synchronizing signal; and a decoding part for decoding the baseband signal whose noise is removed.

The clock demodulation part includes a DC limiter for removing the pilot signal and a synchronizing part for extracting the synchronizing signal from the signal whose pilot signal is removed; the noise removing part includes a channel equalizer for removing a linear noise from the signal whose pilot signal is removed, and a phase tracking unit for removing a residual phase jitter from the signal whose linear noise is removed; and the decoding part includes an FEC unit for decoding the signal the signal whose residual phase jitter is removed.

The present invention provides a carrier recovery apparatus includes: a complex multiplier for multiplying a digitalized passband signal by an oscillation frequency of a frequency phase locked loop (FPLL) and outputting a recovered carrier wave of a baseband signal; the FPLL for filtering a pilot signal from the baseband signal, locking a frequency and phase of the baseband signal by using the filtered pilot signal, and generating the oscillation frequency; and a gain control part for comparing a power value of the baseband signal inputted to the FPLL with a preset reference or threshold value, adjusting a power of the pilot signal contained in the baseband signal outputted from the complex multiplier and outputting the adjusted pilot signal to the FPLL.

The gain control part includes: a power calculator for calculating a power of the baseband signal of the complex multiplier from a signal where data component unnecessary in the carrier recovery is removed among the baseband signals inputted to the FPLL; a comparator for comparing the calculated power value with a preset reference or threshold value; and a gain controller configured between the complex multiplier and the FPLL, for adjusting power of the pilot signal by controlling gain of the baseband signal outputted from the complex multiplier, based on the output result of the comparator, and outputting the recovered carrier wave.

The complex multiplier outputs baseband I and Q signals by multiplying the oscillation frequency by passband I and Q signals if the digitalized passband signal is inputted as baseband I and Q signals having a phase difference of 90°, and the gain controller includes first and second gain controller for controlling gains of the baseband I and Q signals.

The FPLL includes: a frequency locked loop (FLL) for removing unnecessary data component from the baseband I signal passing through the gain controller and for locking a frequency, the FLL being configured with a first LPF, a delay unit, a code detector, a multiplier, a loop filter and a frequency oscillator; and a phase locked loop (PLL) for removing unnecessary data component from the baseband Q signal and for locking a phase, the PLL being configured with a second LPF, the multiplier, the loop filter and the frequency oscillator.

The power calculator calculates power of the baseband I signal passing through the first LPF.

The gain control part includes: a power calculator for calculating a power of the baseband signal of the complex multiplier from a signal where data component unnecessary in the carrier recovery is removed among the baseband signals inputted to the FPLL; a comparator for comparing the calculated power value with a preset reference or threshold value; and a gain controller configured between the a frequency/phase error detector of the FPLL and a loop filter, for adjusting power of the pilot signal by controlling gain of the baseband signal outputted from the frequency/phase error detector, based on the output result of the comparator, and outputting the adjusted pilot signal to the loop filter.

The present invention provides a carrier recovery apparatus including: a complex multiplier for multiplying a digitalized passband signal by an oscillation frequency of an oscillator and outputting a recovered carrier wave of a baseband signal; a first band signal filtering part for outputting I and Q signal components of a first bandwidth, the first bandwidth being a bandwidth of an LPF for extracting a typical pilot signal contained in the baseband signal outputted from the complex multiplier; a second band signal filtering part for outputting I and Q signal components of a second bandwidth among the baseband signals outputted from the complex multiplier, the second bandwidth being narrower than the first bandwidth; a selecting part for receiving the I and Q signal components from the first and second band signal filtering parts and selecting one I and Q signal component among the I and Q signal components outputted from the first and second band signal filtering parts; a power calculating part for calculating a pilot signal power of a baseband I signal passing through the first band signal filtering part, the baseband I signal being outputted from the selecting part; a frequency/phase error detecting part for detecting a frequency/phase error component of the I and Q signals outputted from the selecting part; a gain control part for controlling a gain of the frequency/phase error component outputted from the frequency/phase error detecting part; a comparing part for comparing the calculated pilot signal power with a preset threshold value and generating a control signal for selecting the I and Q signal components outputted from one of the first and second band signal filtering parts, and generating a control signal for controlling the gain of the gain control part according to the pilot signal power; a loop filter for removing an RF component contained in the frequency/phase error component outputted from the gain control part; and an oscillator for changing an oscillation frequency according to the frequency/phase error component whose RF component is removed.

The frequency/phase error detecting part includes: a delay unit and a code detector for detecting a frequency error of the I signal from the I and Q signals outputted from the selecting part; and a multiplier for multiplying the frequency error outputted from the code detector by the phase error contained in the Q signal, and outputting a frequency/phase error.

The carrier recovery apparatus normalizes the gain of the gain control part so as to correspond to the pilot signal power calculated by the power calculating part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 7:
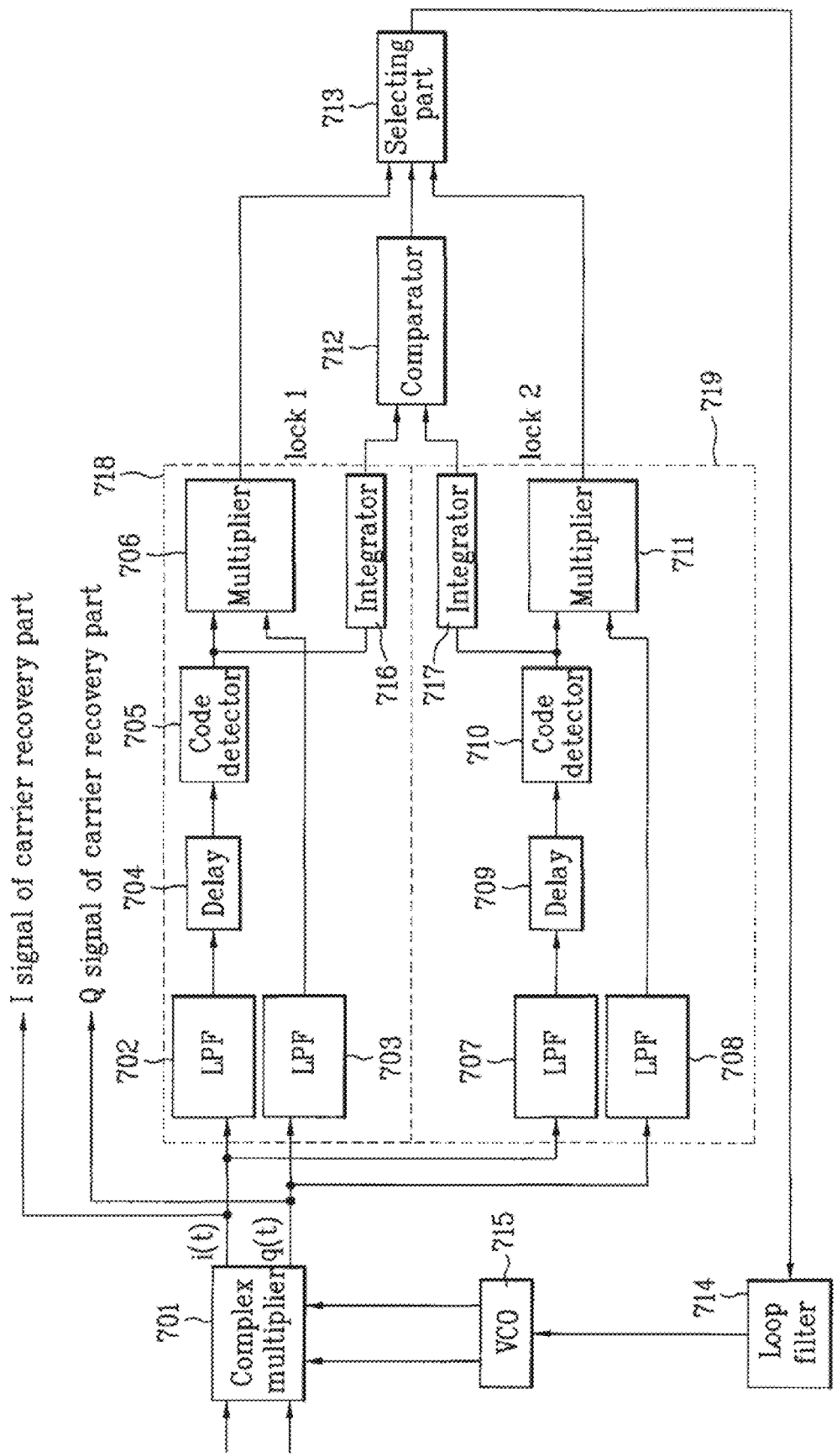
FIG. 7 is a block diagram of a carrier recovery part of a digital TV receiver according to a first embodiment of the present invention.

FIG. 7 is a block diagram of a carrier recovery part of a digital TV receiver according to a first embodiment of the present invention.

Referring to FIG. 7, the carrier recovery part of the digital TV receiver includes a complex multiplier 701, a first band pilot signal and frequency/phase error detecting part 718, a second band pilot signal and frequency/phase error detecting part 719, a comparing part 712, a selecting part 713, a loop filter 714, and a VCO (or an NCO) 715.

The complex multiplier 701 receives an I signal and a Q signal from a delay unit (not shown) and a Hilbert transformer (not shown), multiplies the I signal and the Q signals by an output signal of the VCO 715, and outputs a baseband I signal and a baseband Q signal (carrier wave). The first band pilot signal and frequency/phase error detecting part 718 includes first and second LPFs 702 and 703 having a first bandwidth, a first delay unit 704, a first code detector 705, a first multiplier 706, and a first integrator 716. The first band pilot signal and frequency/phase error detecting part 718 detects a pilot signal component and frequency/phase error component of a first band among the baseband I and Q signals outputted from the complex multiplier 701. The second band pilot signal and frequency/phase error detecting part 719 includes first and second LPFs 707 and 708 having a second bandwidth narrower than the first bandwidth, a second delay unit 709, a second code detector 710, a second multiplier 711, and a second integrator 717. The second band pilot signal and frequency/phase error detecting part 719 detects a pilot signal component and frequency/phase error component of a second band among the baseband I and Q signals outputted from the complex multiplier 701. The comparing part 712 compares the detected pilot signal components, which are outputted from the first and second band pilot signal and frequency/phase error detecting parts 718 and 719. The selecting part 713 selectively outputs the frequency/phase error results, which are respectively outputted from the first and second band pilot signal and frequency/phase error detecting parts 718 and 719, depending on the comparison result of the comparing part 712. The loop filter 714 removes an RF component from the frequency/phase error component, which is outputted from the selecting part 713. The VCO 715 changes an oscillation frequency according to the frequency/phase error component whose RF component is removed.

In the first to sixth embodiments of the present invention, pilot signals are detected with respect to a passband signal at a wide bandwidth and a narrow bandwidth. Thus, when the frequency offset occurs and when the pilot signal is weak, a suitable bandwidth is automatically selected, or a gain of the frequency/phase error information is adjusted.

Figure 1:
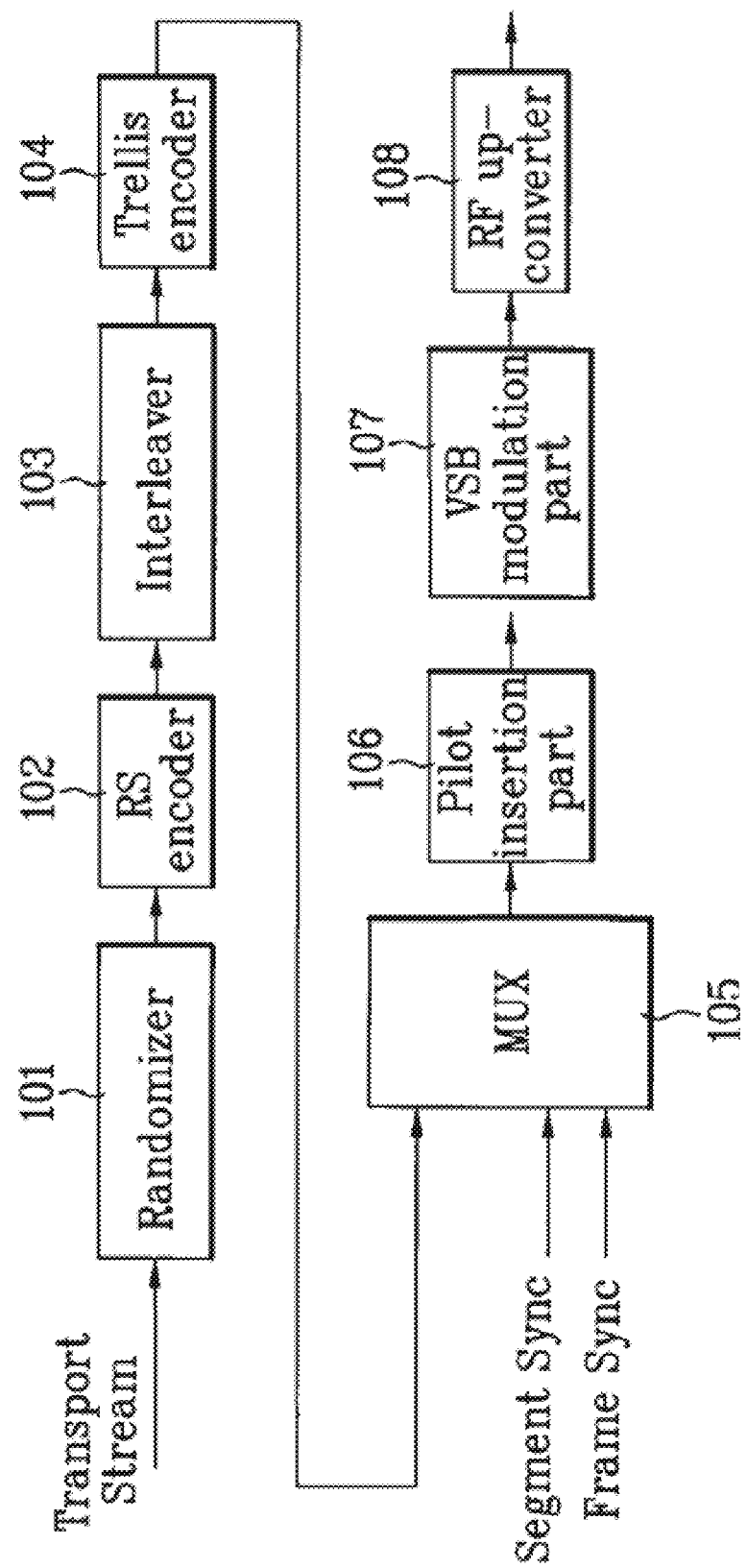
FIG. 1 is a schematic block diagram of a general digital TV transmitter.
Figure 2:
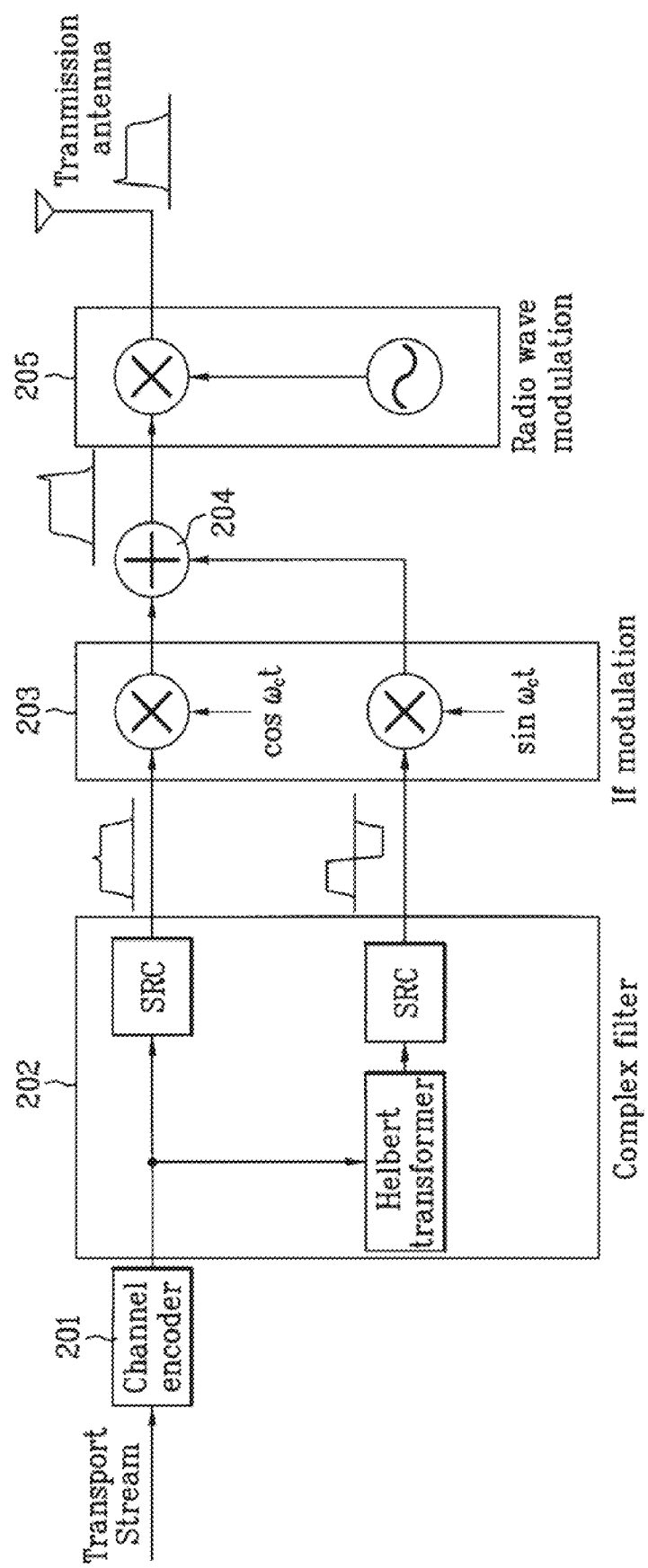
FIG. 2 is a block diagram of a VSB modulation part of the digital TV transmitter shown in FIG. 1.
Figure 3:
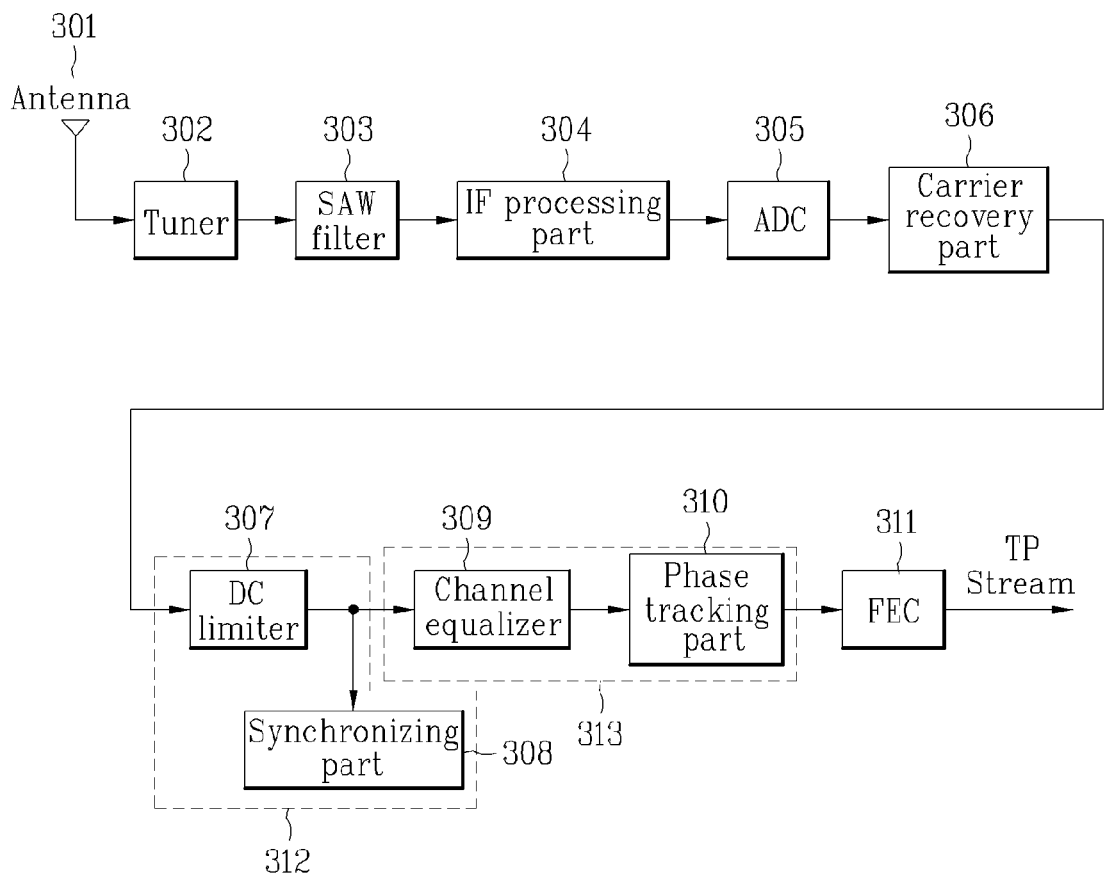
FIG. 3 is a block diagram of a general digital TV receiver.
Figure 4:
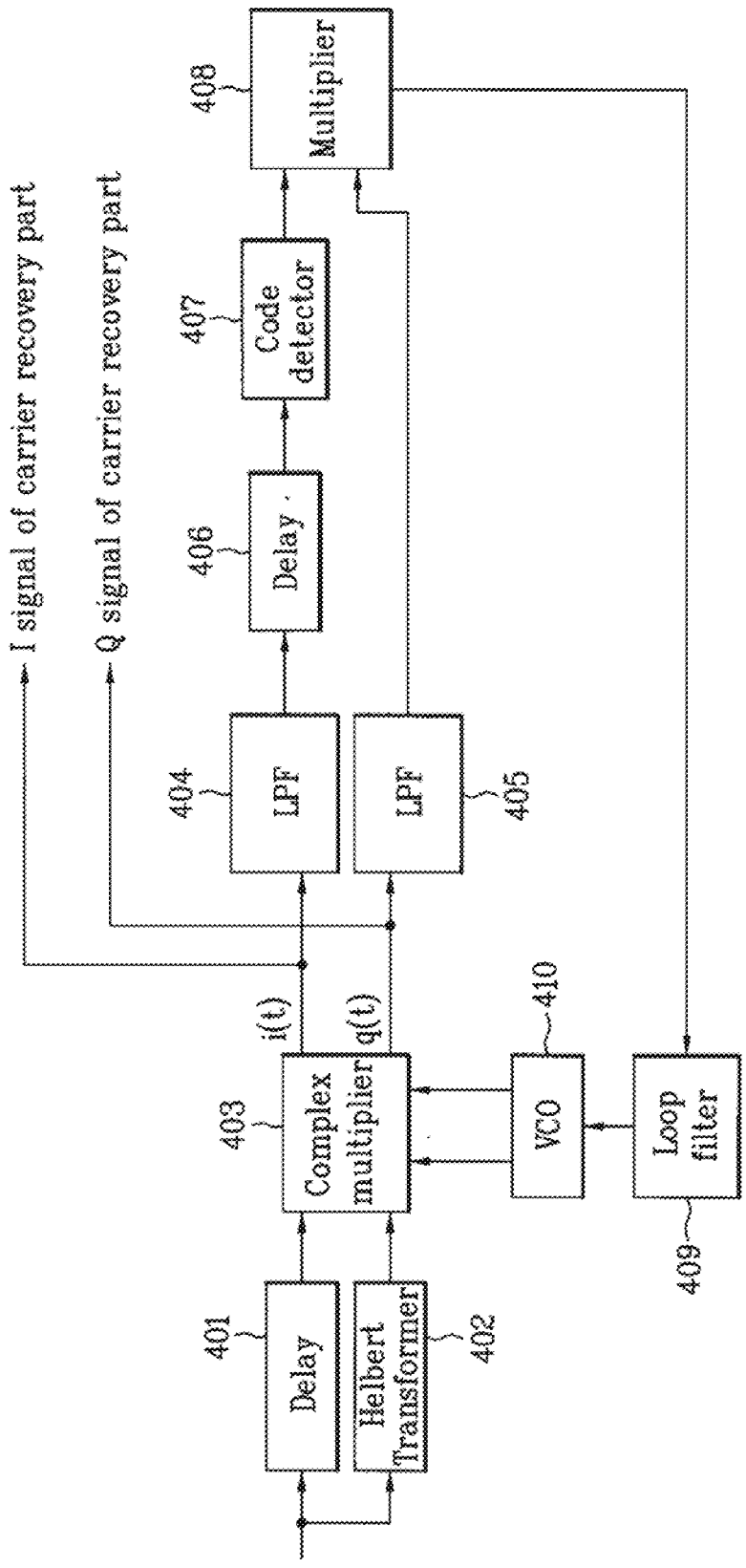
FIG. 4 is a block diagram of a carrier recovery part of the digital TV receiver shown in FIG. 3.
Figure 5A:
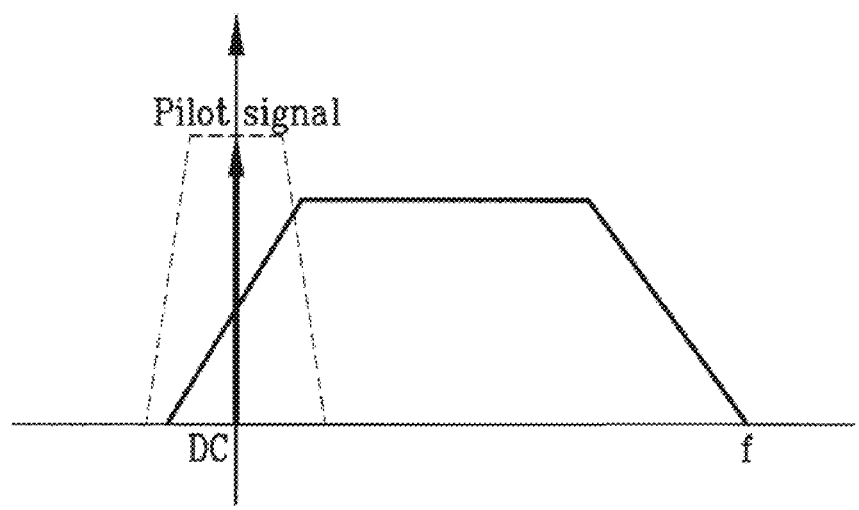
FIGS. 5A to 5C show characteristics of an output signal of a complex multiplier shown in FIG. 4.
Figure 5B:
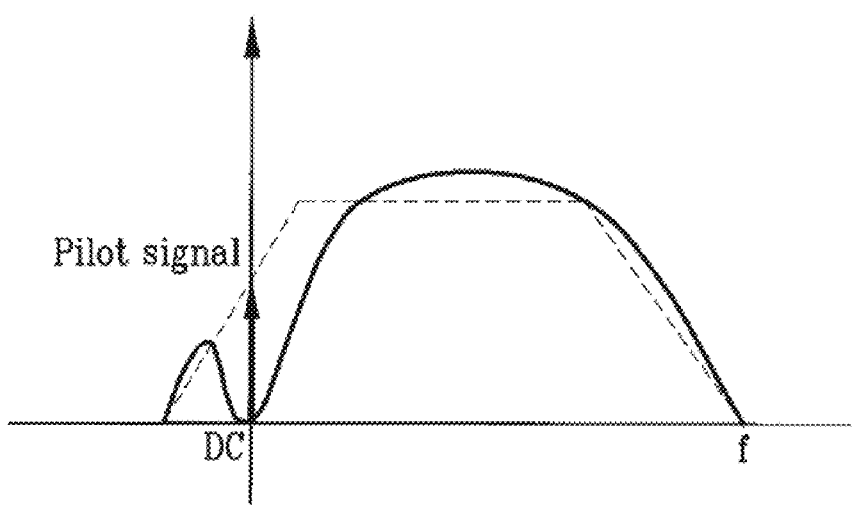
Figure 5C:
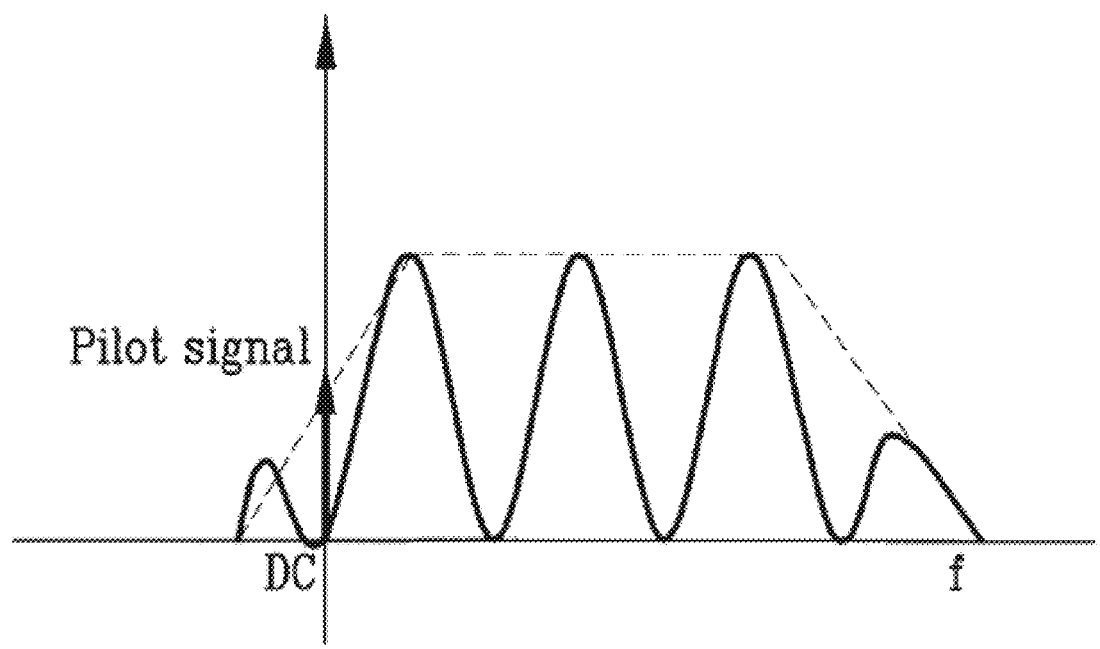
Figure 6A:
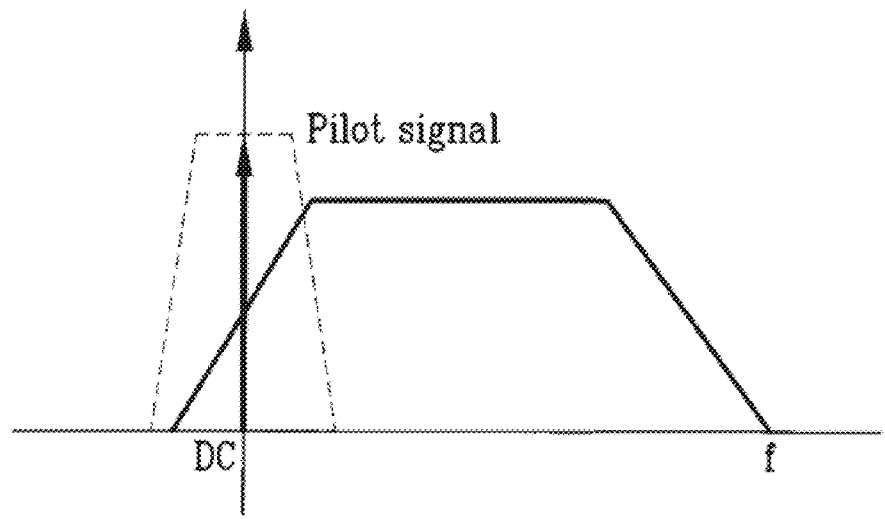
FIGS. 6A to 6C show another characteristics of an output signal of a complex multiplier shown in FIG. 4.
Figure 6B:
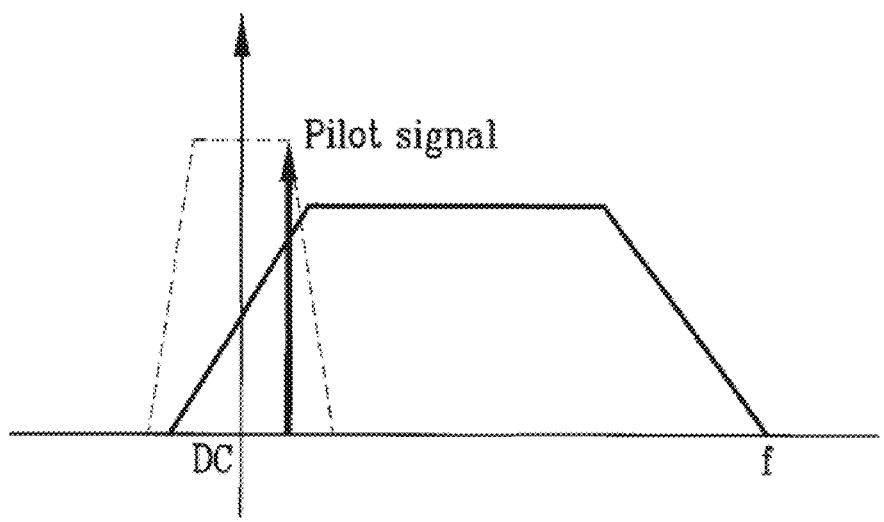
Figure 6C:
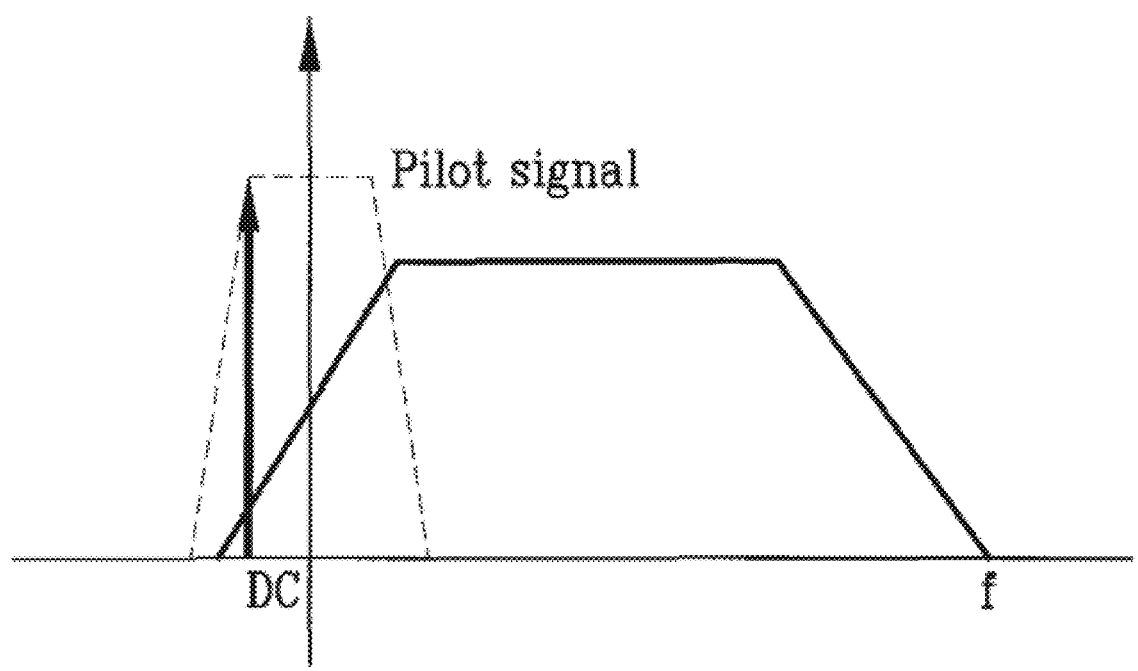

A basic structure of the first to sixth embodiments is similar to that of FIG. 3. However, when the carrier recovery part recovers the carrier wave, a digital processing part selects a desired channel frequency through an antenna and digitalizes it by passing a predetermined band of an intermediate frequency. In this case, the pilot signals are detected at a wide bandwidth and a narrow bandwidth. When the frequency offset occurs or when power of the pilot signal is weak, a fast pilot signal component is detected to thereby recover the carrier wave.

In addition, since the clock demodulation part for removing the pilot signal and extracting the synchronizing signal, the noise removing part for removing a linear noise and a residual phase jitter of the baseband signal by using the synchronizing signal, and the decoding part (for example, the FEC part) for decoding the baseband signal whose noise is removed have the same structures as the general TV receiver, a detailed description thereof will be omitted.

If the first bandwidth is equal to the bandwidth used to detect the pilot signal at the conventional carrier recovery part, it is assumed that the first and second LPFs 707 and 708 of the second bandwidth have relatively narrow bandwidths (for example, ½ to ¼) than the first and second LPFs 702 and 703 of the first band. That is, the first bandwidth is used to extract the pilot signal component when the frequency offset exists at a wide band, and the second bandwidth is used to extract the weak pilot signal component at a narrow band.

Generally, if the frequency is fixed by the FPLL, the pilot signal is positioned at a DC and the first and second code detectors 705 and 710 continuously extract and output "1".

At this point, the pilot signal component passing through the first LPF 702 of the first band is accumulated at the first integrator 716 through the first code detector 705 and the pilot signal component passing through the first LPF 707 of the second band is accumulated at the second integrator 717 through the second code detector 710.

When the accumulated values reach pilot power levels (threshold) that are set to the respective integrators, the first and second integrators 716 and 717 generate frequency lock signals.

The output values of the first and second integrators 716 and 717 can represent the information on the convergence/divergence of the frequency locked loop (FLL). In order to select one of the two loops, the values accumulated at the first and second integrators 716 and 717 need to be checked by using the threshold values of the respective integrators 716 and 717, specifically the threshold value less than the lock value. In the case of the first integrator 716, it will be referred to as a first threshold value lock1 and in the case of the second integrator 717, it will be referred to as a second threshold value lock2.

That is, the first integrator 716 transfers the convergence state to the comparing part 712 at the loop of the first band pilot signal and frequency/phase error detecting part 718, and the second integrator 717 transfers the convergence state to the comparing part 712 at the loop of the second band pilot signal and frequency/phase error detecting part 719. In this manner, the comparing part 712 can fast select a loop suitable for the convergence from the two loops by applying the first and second threshold values lock1 and lock2 lower than the original threshold value (lock).

If the entire loop includes the FPLL loop configured with the LPFs 702 and 703 having a wide bandwidth and the FPLL loop configured with the LPFs 707 and 708 having a narrow bandwidth, the respective loops generate new lock signals lock1 and lock2 according to new threshold values and the comparing part 712 compares the two new lock values and generates a selection signal to the selecting part 713 so as to enable the selection of one loop.

At this point, by making the loop having a wide bandwidth satisfy a frequency locking range recommended at the DTV standard of the ATSC, the comparing part 712 compares the two lock signals lock1 and lock2. In a general channel situation where the pilot signal is normally received, a loop having a wide bandwidth is used. Also, in case where both the loops are locked, the loop having the wide bandwidth is used for stability of the loop.

Figure 13A:
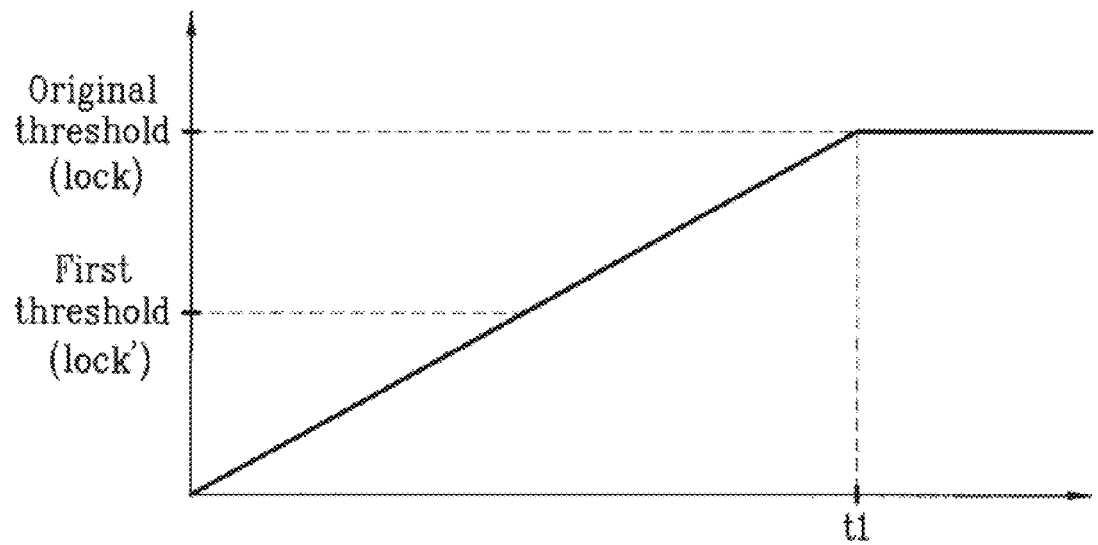
FIGS. 13A and 13B shows detection of a pilot signal based on a bandwidth selected by a carrier recovery part according to the present invention.
Figure 13B:
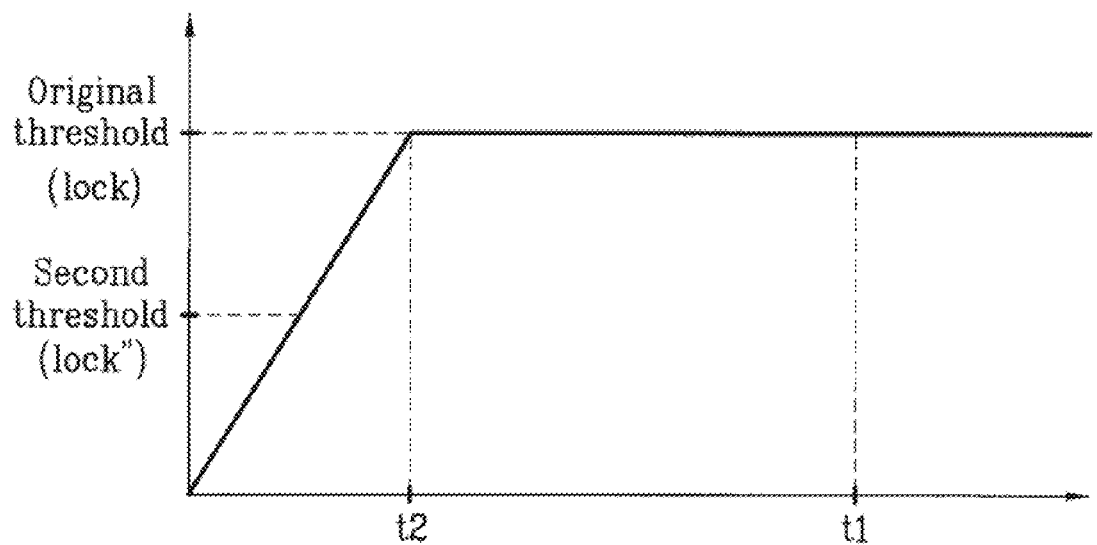

FIG. 13A shows the detection of the pilot signal component at the first and second LPFs 702 and 703 of the first bandwidth, and FIG. 13B shows the detection of the pilot signal component at the first and second LPFs 707 and 708 of the second bandwidth narrower than the first bandwidth. The output result of the comparing part 712 can allow the fast selection of the suitable loop among the output results of the integrators 716 and 717 by applying the first and second threshold values lock1 and lock2. Accordingly, if the power of the pilot signal component is greater than the first threshold value lock1, the pilot signal of the LPF side having a wide frequency bandwidth is detected such that the pilot signal detection error is prevented, as shown in FIG. 13A. If the power of the pilot signal component is greater than the second threshold value lock2, the pilot signal of the LPF side having a narrow frequency bandwidth is detected. In this manner, when the power of the pilot signal is weak, the pilot signal detection error can be minimized.

Like this, if the one loop of the first band pilot signal and frequency/phase error detecting part 718 and the second band pilot signal and frequency/phase error detecting part 719 is decided, the selecting part 713 outputs only the frequency/phase error component (control component) of the decided loop to the loop filter 714. The loop filter 714 removes RF component contained in the frequency/phase error component and outputs the resulting signal to the VCO 715. The VCO 715 changes the oscillation frequency according to the controlled voltage and outputs to the complex multiplier 701. At this point, the FPLL is configured with the pilot signal and frequency/phase error detecting part of the decided loop, the loop filter 714, and the VCO 715.

Figure 8:
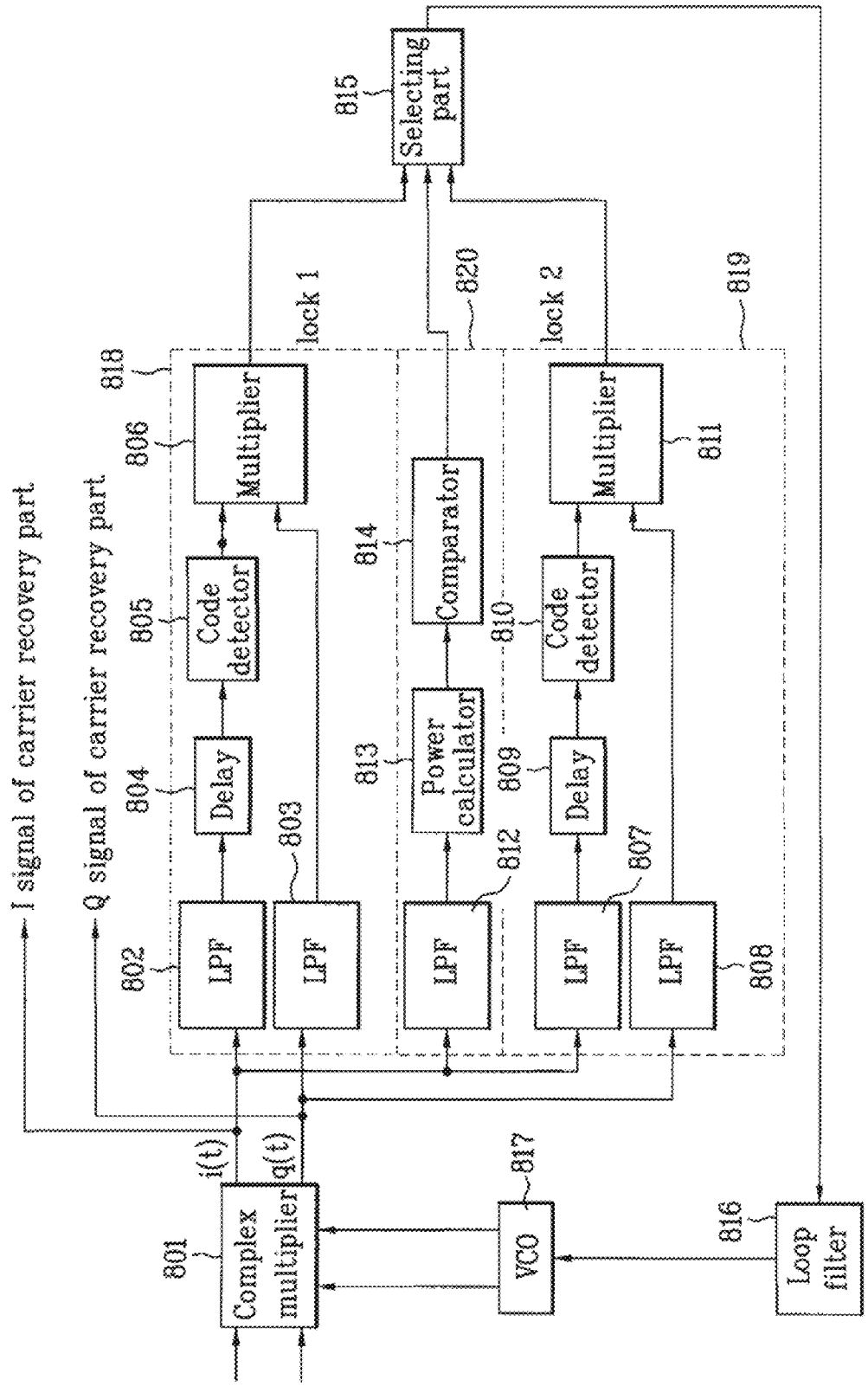
FIG. 8 is a block diagram of a carrier recovery part of a digital TV receiver according to a second embodiment of the present invention.

FIG. 8 is a block diagram of a carrier recovery part of a digital TV receiver according to a second embodiment of the present invention.

Referring to FIG. 8, the carrier recovery part of the digital TV receiver includes a complex multiplier 801, a first frequency/phase error detecting part 818, a second frequency/phase error detecting part 819, a pilot power comparing part 820, a selecting part 815, a loop filter 816, and a VCO 817.

The complex multiplier 810 receives an I signal and a Q signal from a delay unit (not shown) and a Hilbert transformer (not shown), multiplies the I signal and the Q signals by an output signal of the VCO (or NCO) 817, and outputs a baseband I signal and a baseband Q signal (carrier wave). The first frequency/phase error detecting part 818 includes first and second LPFs 802 and 803 having a first bandwidth, a first delay unit 804, a first code detector 805, and a first multiplier 806. The first frequency/phase error detecting part 818 detects a first frequency/phase error component of a first band among the baseband I and Q signals outputted from the complex multiplier 801. The second frequency/phase error detecting part 819 includes first and second LPFs 807 and 808 having a second bandwidth narrower than the first bandwidth, a second delay unit 809, a second code detector 810 and a second multiplier 811. The second frequency/phase error detecting part 819 detects a frequency/phase error component of a second band among the baseband I and Q signals outputted from the complex multiplier 801. The pilot power comparing part 820 includes a third LPF 812, a power calculator 813 and a comparator 814. The pilot power comparing part 820 extracts a pilot signal from the baseband I signal, compares power of the pilot signal with a preset threshold value, and generates a control signal for selecting one of the results outputted from the first and second frequency/phase error detecting parts 818 and 819. The selecting part 815 selectively outputs one of the frequency/phase error results outputted from the first and second frequency/phase error detecting parts 818 and 819, depending on the comparison result of the comparing part 820. The loop filter 816 removes an RF component from the frequency/phase error component, which is outputted from the selecting part 815. The VCO 715 changes an oscillation frequency according to the frequency/phase error component whose RF component is removed.

The first bandwidth and the second bandwidth of the second embodiment have the same range as those of the first embodiment. The third LPF 812 of the pilot power comparing part 820 passes only the signal of a frequency bandwidth where the pilot signal is contained among the baseband I signal outputted from the complex multiplier 801, and the power calculator 813 calculates the power of the pilot signal and transmits it to the comparing part 814.

That is, the comparing part 820 compares the power of the pilot signal with the preset threshold value. If the power of the pilot signal is greater than the threshold value, the comparing part 820 generates the control signal for selecting the first frequency/phase error detecting part 818. If the power of the pilot signal is less than the threshold value, the comparing part 820 generates the control signal for selecting the second frequency/phase error detecting part 819.

The selecting part 815 outputs the frequency/phase error component (control component) of the decided loop (the first frequency/phase error detecting parts 818 or the second frequency/phase error detecting part 819) to the loop filter 816. The loop filter 816 removes RF component contained in the frequency/phase error component (control component) and outputs the resulting signal to the VCO 817. The VCO 817 changes the oscillation frequency according to the controlled voltage and outputs to the complex multiplier 801. At this point, the frequency/phase error detecting part of the decided loop, the loop filter 816 and the VCO 817 operate as the FPLL.

Figure 9:
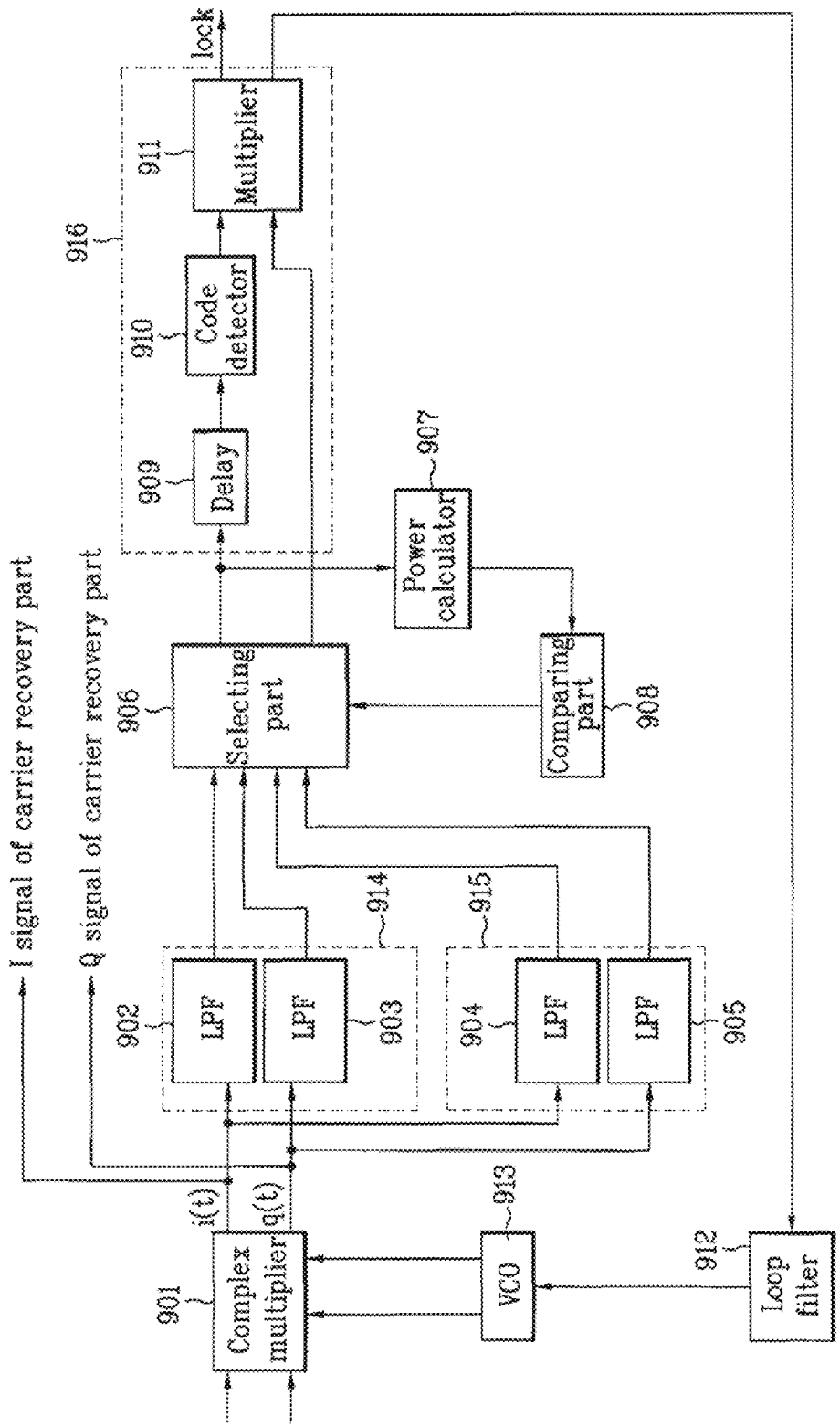
FIG. 9 is a block diagram of a carrier recovery part of a digital TV receiver according to a third embodiment of the present invention.

FIG. 9 is a block diagram of a carrier recovery part of a digital TV receiver according to a third embodiment of the present invention.

Referring to FIG. 9, the carrier recovery part of the digital TV receiver includes a complex multiplier 901, a first band signal filtering part 914, a second band signal filtering part 915, a selecting part 906, a power calculating part 907, a comparing part 908, a frequency/phase error detecting part 916, a loop filter 912, and a VCO (or NCO) 913.

The complex multiplier 810 receives an I signal and a Q signal from a delay unit (not shown) and a Hilbert transformer (not shown), multiplies the I signal and the Q signals by an output signal of the VCO (or NCO) 913, and outputs a baseband I signal and a baseband Q signal (carrier wave). The first band signal filtering part 914 includes first and second LPFs 902 and 903 having a first bandwidth and filters a signal component except the I and Q signal components of the first band among the baseband signals outputted from the complex multiplier 901. The second band signal filtering part 915 includes first and second LPFs 904 and 905 having a second bandwidth and filters a signal component except the I and Q signal components of the second band among the baseband signals outputted from the complex multiplier 901.

The selecting part 906 selectively outputs the I and Q signals of one band among the I and Q signals of the first and second bands, which are respectively outputted from the first band signal filtering part 914 and the second band signal filtering part 915. The power calculating part 907 calculates the power of the pilot signal by using the I signal outputted from the selecting part 906. The comparing part 908 compares the power of the pilot signal with a preset threshold value and generates a control signal for selecting one of the output signals of the first and second band signal filtering parts 914 and 915. The frequency/phase error detecting part 916 includes a delay unit 909, a code detector 910 and a multiplier 911 and detects a frequency/phase error component of the I and Q signals outputted from the selecting part 906. The loop filter 912 removes an RF component from the frequency/phase error component, which is outputted from the frequency/phase error detecting part 916. The VCO (or NCO) 913 changes an oscillation frequency according to the frequency/phase error component whose RF component is removed.

The first bandwidth and the second bandwidth of the third embodiment have the same range as those of the first embodiment. The selecting part 906 passes the signal of a frequency bandwidth where the pilot signal is contained among the I signal outputted from the first LPF 902 of the first bandwidth and the first LPF 904 of the second bandwidth, and the power calculating part 907 calculates the power of the pilot signal and transmits it to the comparing part 908.

The comparing part 809 compares the power of the pilot signal with the preset threshold value. If the power of the pilot signal is greater than the threshold value, the comparing part 809 generates the control signal for selecting the first band signal filtering part 914. If the power of the pilot signal is less than the threshold value, the comparing part 808 generates the control signal for selecting the second band signal filtering part 915.

The selecting part 906 outputs the baseband I and Q signals, which are outputted from one of the first and second band signal filtering parts 914 and 915 according to the control signal of the comparing part 908, to the frequency/phase error detecting part 916.

Then, the frequency/phase error detecting part 916 outputs a frequency/phase error detecting component (control component) to the loop filter 912. The loop filter 912 removes RF component contained in the frequency/phase error component and outputs the resulting signal to the VCO 913. The VCO 913 changes the oscillation frequency according to the controlled voltage and outputs to the complex multiplier 901. At this point, the selected band signal filtering part 914 or 915, the frequency/phase error detecting part 916, the loop filter 912 and the VCO 913 operate as the FPLL.

Compared with the first and second embodiments, the third embodiment can automatically select the necessary bandwidth by using a few elements and can also stabilize the receiver much more under fast changing channel conditions.

Figure 10:
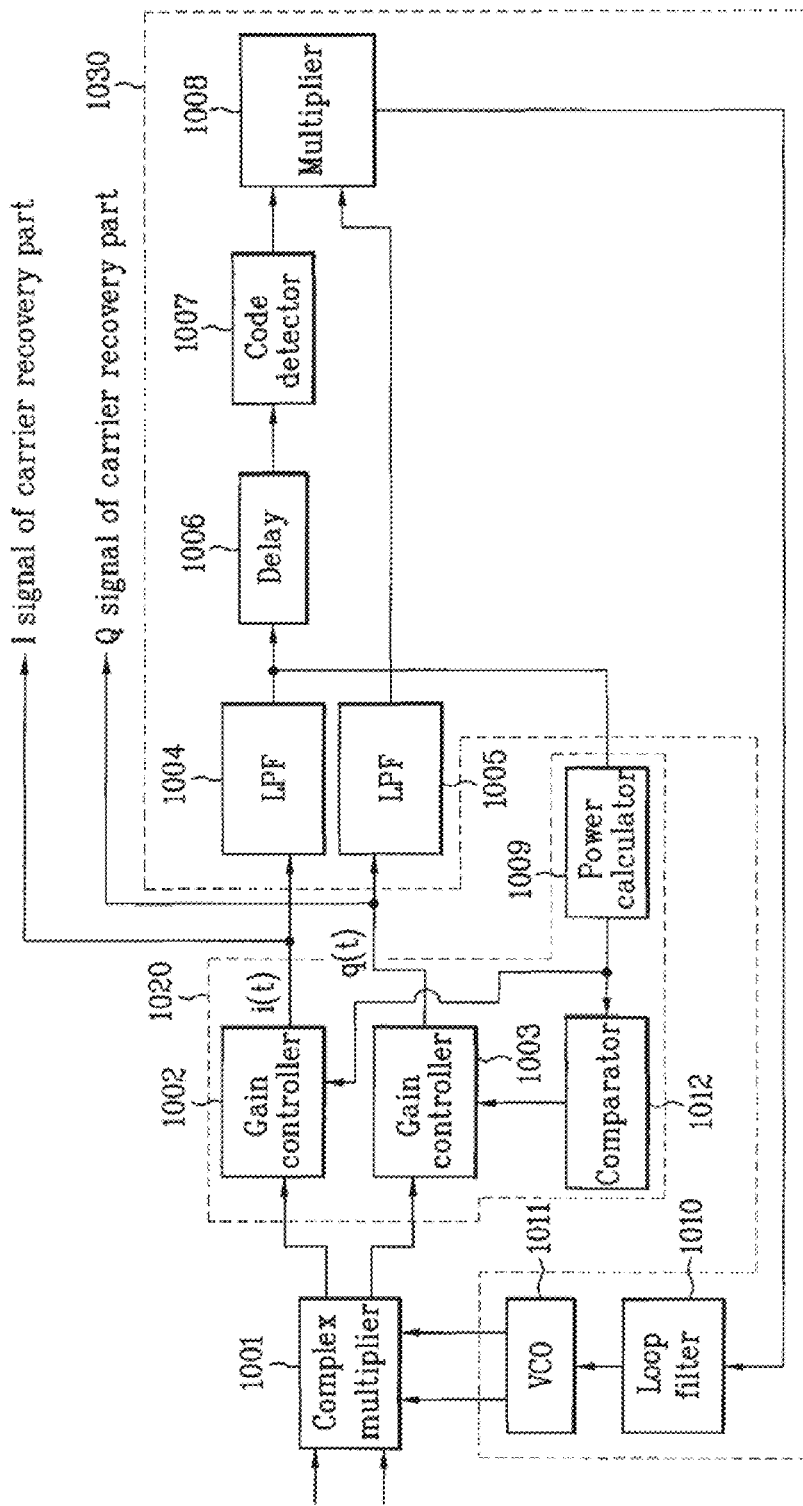
FIG. 10 is a block diagram of a carrier recovery part of a digital TV receiver according to a fourth embodiment of the present invention.

FIG. 10 is a block diagram of a carrier recovery part of a digital TV receiver according to a fourth embodiment of the present invention.

Referring to FIG. 10 the carrier recovery part of the digital TV receiver includes a complex multiplier 1001, an FPLL 1030, and a gain control part 1020.

If the passband analog signal is converted into the digital signal, a Hilbert transformer (not shown) shifts the signal by 90° such that the digital signal is transformed into a Q signal of an imaginary component. A delay unit (not shown) delays the digital signal by a predetermined time when the digital signal is transformed into the Q signal at the Hilbert transformer, and then outputs an I signal of a real component. The complex multiplier 1001 multiplies the I and Q signals by an output signal of a VCO (or NCO) 1011 to output a baseband I signal and a baseband Q signal (carrier wave). The FPLL 1030 includes a frequency locked loop (FLL) for locking a frequency of the baseband I signal and a phase locked loop (PLL) for locking a phase of the Q signal. The FLL is configured with a first LPF 1004, a delay unit 1006, a code detector 1007, a multiplier 1008, a loop filter 1010 and a VCO 1011. The PLL is configured with a second LPF 1005, the multiplier 1008, the loop filter 1001 and the VCO 1011. The gain control part 1020 includes a power calculator 1009, a comparator 1012, and first and second gain controllers 1002 and 1003. The power calculator 1009 calculates a pilot power of the I signal outputted from the first LPF 1004, and the comparator 1012 compares the pilot power of the I signal with a preset threshold value. The first and second gain controllers 1002 and 1003 are configured between the complex multiplier 1001 and the LPFs 1004 and 1005 and controls power of the pilot signal for recovering the carrier wave by adjusting the gain of the I and Q signals outputted from the complex multiplier 1001 according to the comparison result of the comparator 1012, and then outputs it to the FPLL 1030.

A basic structure of the fourth embodiment is similar to that of FIG. 3. However, when the carrier recovery part recovers the carrier wave, a digital processing part selects a desired channel frequency through an antenna, converts the channel frequency into an intermediate frequency, and digitalizes it by passing a predetermined band of the intermediate frequency. Then, the power value of the signal outputted from the first LPF 1004 for removing unnecessary signals among the passband signal in the carrier recovery is compared with the preset reference or threshold value. Then, the carrier wave is recovered by setting the pilot component of the digitalized passband signal to the desired gain according to the comparison result. In addition, since a clock demodulation part for removing the pilot signal and extracting a synchronizing signal, a noise removing part for removing a linear noise and a residual phase jitter of the baseband signal by using the synchronizing signal, and a decoding part (for example, an FEC part) for decoding the baseband signal, whose noise is removed, have the same structures as the general TV receiver, a detailed description thereof will be omitted.

As described above, the FPLL algorithm performs the carrier recovery based on the pilot signal. Accordingly, the first LPF 1004 is used to remove data component unnecessary in the carrier recovery, and the power calculator 1009 calculates the power of the pilot signal outputted from the first LPF 1004.

The gain control parts 1002 and 1003 controls the gain of the input signals of the first and second LPFs 1004 and 1005 (that is, the I and Q output signals) by using the pilot power.

Therefore, the gain of the input signals of the LPFs can be controlled according to the degree of the signals outputted from the first and second LPFs 1004 and 1005, which are reduced as the power of the pilot signal gets weak. In normalizing the gain control of the input signals according to the pilot power of the signal inputted to the first and second LPFs 1004 and 1005, even when the pilot power becomes weak due to the linear noise, the first and second LPFs 1004 and 1005 can receive the pilot signal having a predetermined power. It means that the entire gain of the FPLL loop can rise by increasing the pilot signal having the weak power.

Figure 11:
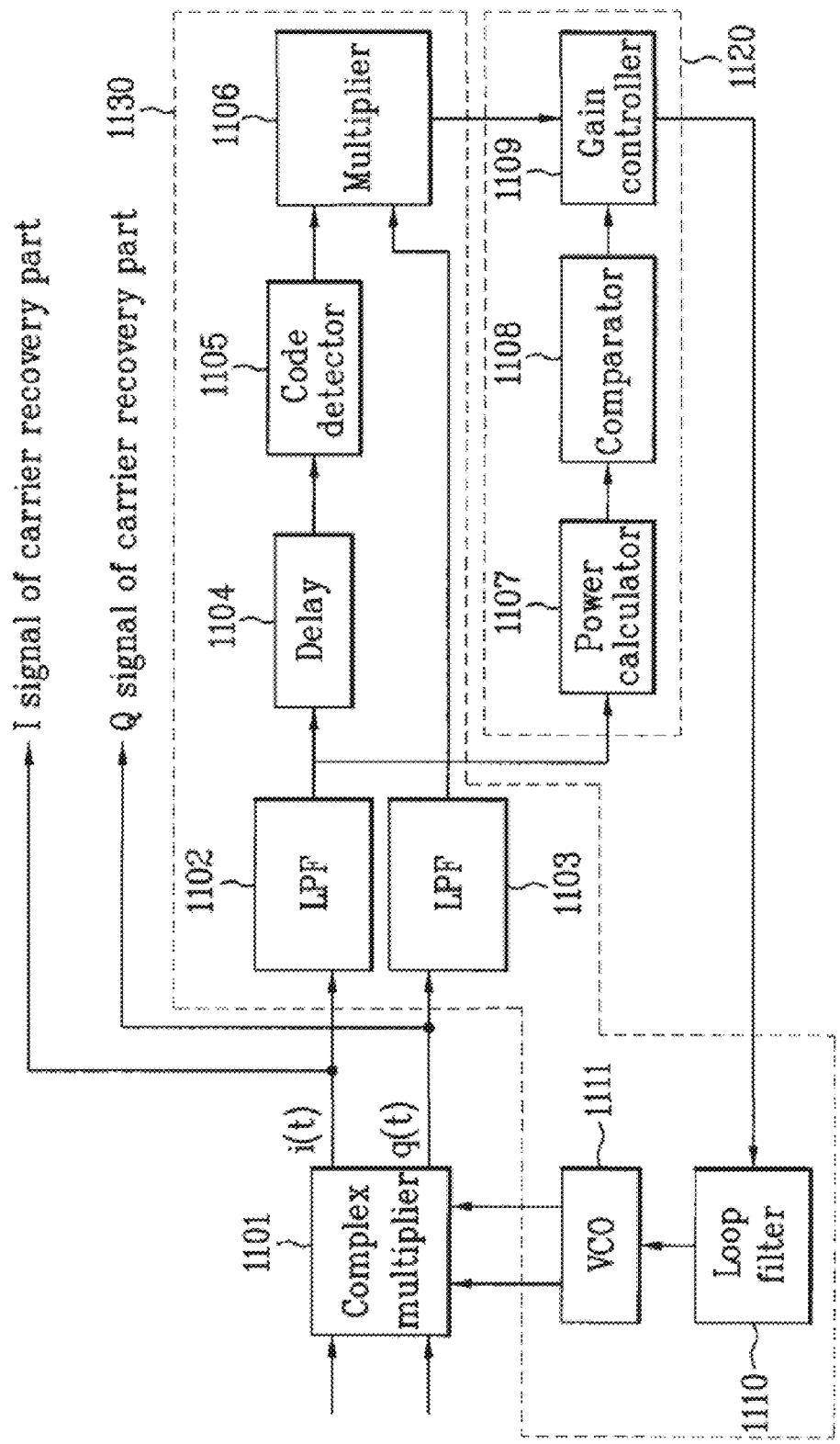
FIG. 11 is a block diagram of a carrier recovery part of a digital TV receiver according to a fifth embodiment of the present invention.

FIG. 11 is a block diagram of a carrier recovery part of a digital TV receiver according to a fifth embodiment of the present invention.

Referring to FIG. 11, the carrier recovery part of the digital TV receiver includes a complex multiplier 1101, an FPLL 1130, and a gain control part 1120.

If the passband analog signal is converted into the digital signal, a Hilbert transformer (not shown) shifts the signal by 90° such that the digital signal is transformed into a Q signal of an imaginary component. A delay unit (not shown) delays the digital signal by a predetermined time when the digital signal is transformed into the Q signal at the Hilbert transformer, and then outputs an I signal of a real component. The complex multiplier 1101 multiplies the I and Q signals by an output signal of a VCO (or NCO) 1111 to output a baseband I signal and a baseband Q signal (carrier wave). The FPLL 1130 includes a frequency locked loop (FLL) for locking a frequency of the baseband I signal and a phase locked loop (PLL) for locking a phase of the Q signal. The FLL is configured with a first LPF 1102, a delay unit 1104, a code detector 1105, a multiplier 1106, a loop filter 1110 and a VCO 1111. The PLL is configured with a second LPF 1103, the multiplier 1106, the loop filter 1110 and the VCO 1111. The gain control part 1120 includes a power calculator 1107, a comparator 1108, and a gain controller 1109. The power calculator 1107 calculates a pilot power of the I signal outputted from the first LPF 1102, and the comparator 1108 compares the pilot power of the I signal with a preset threshold or reference value. The gain controller 1109 receives the output of the multiplier 1106 and the output of the comparator 1108, controls gain of the frequency/phase error component outputted from the multiplier 1106, and outputs it to the loop filter 1110.

In the fifth embodiment, the complex multiplier 1101 actually outputs the I and Q signal of the carrier recovery part.

At this point, when the gain of the first LPF 1102 is "1", the code detector 1105 does not influence the gain of the signal at all. Thus, the gain controller 1109 of FIG. 11 is equivalent to that of FIG. 10 in which the gain controller is disposed at a next stage of the multiplier.

In FIG. 11, it can be considered that the gain controller 1109 controls the gain of the multiplier (error detector) 1106. Also, when the pilot signal is weak, the entire gain is controlled by increasing the gain of the error extracted by the multiplier 11106.

Figure 12:
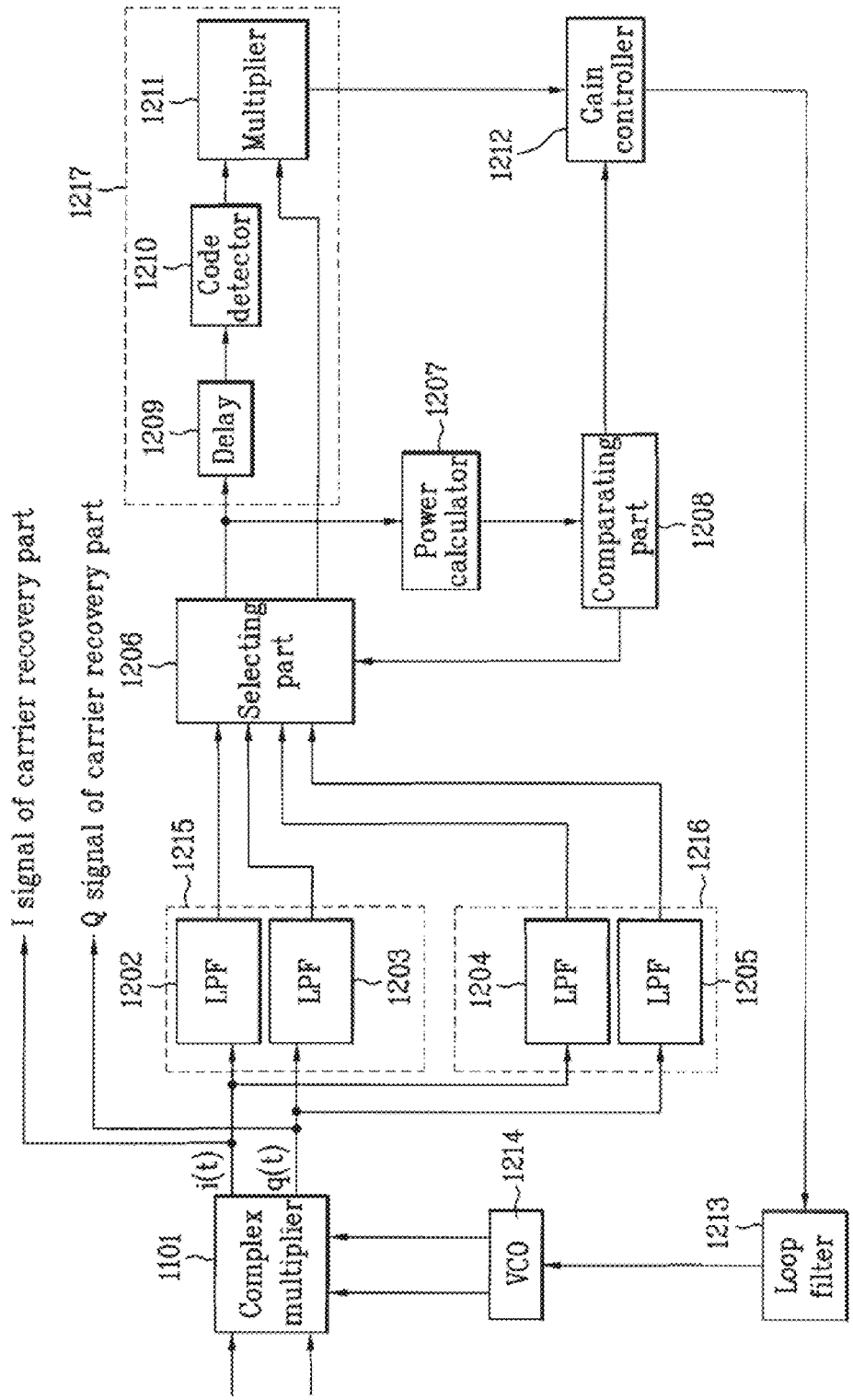
FIG. 12 is a block diagram of a carrier recovery part of a digital TV receiver according to a sixth embodiment of the present invention.

FIG. 12 is a block diagram of a carrier recovery part of a digital TV receiver according to a sixth embodiment of the present invention.

Referring to FIG. 12, the carrier recovery part of the digital TV receiver includes a complex multiplier 1201, a first band pilot signal filtering part 1215, a second band pilot signal filtering part 1216, a selecting part 1206, a frequency/phase error detecting part 1217, a power calculating part 1207, a comparing part 1208, a gain control part 1212, a loop filter 1213, and a VCO 1214.

The complex multiplier 1201 receives an I signal and a Q signal from a delay unit (not shown) and a Hilbert transformer (not shown), multiplies the I signal and the Q signals by an output signal of the VCO 1214, and outputs a baseband I signal and a baseband Q signal (carrier wave). The first band pilot signal filtering part 1215 includes first and second LPFs 1202 and 1203 having a first bandwidth and outputs a pilot signal component of a first band among the baseband I and Q signals outputted from the complex multiplier 1201. The second band pilot signal filtering part 1216 includes first and second LPFs 1204 and 1205 having a second bandwidth and outputs a pilot signal component of a second band among the baseband I and Q signals outputted from the complex multiplier 1201.

The selecting part 1206 selectively outputs the I and Q signals of one band among the I and Q signals of the first and second bands, which are respectively outputted from the first band pilot signal filtering part 1215 and the second band pilot signal filtering part 1216. The frequency/phase error detecting part 1217 includes a delay unit 1209, a code detector 1210 and a multiplier 1211 and detects a frequency/phase error component from the I and Q signals outputted from the selecting part 1206. The power calculating part 1207 calculates the power of the pilot signal at the signal outputted from the selecting part 1206. The comparing part 1208 compares the power of the pilot signal with a preset threshold or reference value. Then, the comparing part 1208 generates a control signal for selecting one of the output signals of the first and second band pilot signal filtering parts 1215 and 1216 to the selecting part 1206. Also, the comparing part 1208 generates a control signal for controlling gain of the output signal of the frequency/phase error detecting part 1217 to the gain control part 1212. The gain control part 1212 controls the gain of the frequency/phase error component outputted from the frequency/phase error detecting part 1217 according to the comparison result of the comparing part 1208. The loop filter 1213 removes an RF component from the frequency/phase error component, which is outputted from the gain control part 1212. The VCO 1214 changes an oscillation frequency according to the frequency/phase error component whose RF component is removed.

The first bandwidth and the second bandwidth of the sixth embodiment have the same range as those of the first embodiment. The selecting part 1206 passes the signal of a frequency bandwidth where the pilot signal is contained among the I signals outputted from the first LPF 1202 of the first bandwidth and the first LPF 1204 of the second bandwidth, and the power calculating part 1207 calculates the power of the pilot signal and transmits it to the comparing part 1208.

The comparing part 1208 compares the power of the pilot signal with the preset threshold value. If the power of the pilot signal is greater than the threshold value, the comparing part 1208 generates the control signal for selecting the first band pilot signal filtering part 1215. If the power of the pilot signal is less than the threshold value, the comparing part 1208 generates the control signal for selecting the second band pilot signal filtering part 1216. In addition, the comparing part 1208 allows the gain control part 1212 to control the gain of the pilot power according to the comparison result. At this point, it is possible when the gain control of the gain control part 1212 is normalized corresponding to the output signals of the first and second LPFs 1204 and 1205 of the second bandwidth, which are reduced as the pilot power gets weak. That is, it means that the entire gain of the FPLL loop can rise by increasing the pilot signal having the weak power.

Then, the selecting part 1206 outputs the baseband I and Q signals, which are outputted from one of the first and second band pilot signal filtering parts 1215 and 1216, to the frequency/phase error detecting part 1217 according to the control signal of the comparing part 1208.

The frequency/phase error detecting part 1217 outputs the frequency/phase error detection component (control component) to the gain control part 1212. The gain control part 1212 controls the gain of the frequency/phase error component according to the comparison result of the comparing part 1208 and outputs to the loop filter 1213. The loop filter 1213 removes RF component contained in the frequency/phase error component and outputs the resulting signal to the VCO 1214. The VCO 1214 changes the oscillation frequency according to the controlled voltage and outputs to the complex multiplier 1201. At this point, the selected pilot signal filtering part 1215 or 1216, the frequency/phase error detecting part 1217, the loop filter 1213 and the VCO 1214 operate as the FPLL.

As described above, since the gain of the FPLL loop and the bandwidth of the LPFs are automatically controlled according to the received pilot power, the carrier recovery can be more stably performed even when the pilot signal is weak.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A carrier recovery apparatus comprising:
   a complex multiplier for multiplying a digitalized passband signal by an oscillation frequency of an oscillator and outputting a recovered carrier wave of a baseband signal;
   a first band pilot signal and frequency/phase error detecting part for outputting a pilot signal component and a frequency/phase error component of a first bandwidth, the first bandwidth being a bandwidth of a low pass filter (LPF) for extracting a typical pilot signal contained in the baseband signal output from the complex multiplier;
   a second band pilot signal and frequency/phase error detecting part for outputting a pilot signal component and a frequency/phase error component of a second bandwidth among the baseband signals output from the complex multiplier, the second bandwidth being narrower than the first bandwidth;
   a comparing part for comparing the pilot signal components output from the first band pilot signal and frequency/phase error detecting part and the second band pilot signal and frequency/phase error detecting part, and outputting a first selection signal for selecting one of output results of the first band pilot signal and frequency/phase error detecting part and the second band pilot signal and frequency/phase detecting part;
   a selecting part for selecting one of the frequency/phase error components output from the first band pilot signal and frequency/phase error detecting part and the second band pilot signal and frequency/phase error detecting part, the selection based on the first selection signal;
   a loop filter for removing a radio frequency (RF) component contained in the selected frequency/phase error component; and
   the oscillator for changing the oscillation frequency according to the selected frequency/phase error component whose RF component is removed.

2. The carrier recovery apparatus of claim 1, wherein:
   the first band pilot signal and frequency/phase error detecting part comprises:
   a first LPF, a first delay unit and a first code detector for forming a loop for receiving a baseband I signal from the complex multiplier and detecting the pilot signal component and the frequency error component of the first bandwidth;
   a second LPF for forming a loop for receiving a baseband Q signal from the complex multiplier and detecting a phase error of the first bandwidth;
   a first multiplier for multiplying the frequency error component by the phase error and detecting a frequency/phase error; and
   a first integrator for accumulating power of the pilot signal component output from the first code detector, and generating and providing a lock signal to the comparing part if the accumulated power of the pilot signal component reaches a first preset pilot power threshold value; and
   the second band pilot signal and frequency/phase error detecting part comprises:
   a first LPF, a second delay unit and a second code detector for forming a loop for receiving the baseband I signal from the complex multiplier and detecting the pilot signal component and the frequency error component of the second bandwidth;
   a second LPF for forming a loop for receiving the baseband Q signal from the complex multiplier and detecting a phase error of the second bandwidth;
   a second multiplier for multiplying the frequency error component by the phase error of the second band width and detecting a frequency/phase error; and
   a second integrator for accumulating power of the pilot signal component output from the second code detector, and generating and providing a lock signal to the comparing part if the accumulated power of the pilot signal component reaches a second preset pilot power threshold value.

3. The carrier recovery apparatus of claim 2, wherein the first preset pilot power threshold value is greater than the second preset pilot power threshold value.

4. The carrier recovery apparatus of claim 1, wherein the comparing part is further for comparing a new first threshold value generated from the first band pilot signal and frequency/phase error detecting part to a new second threshold value generated from the second band pilot signal and frequency/phase error detecting part, and outputting a second selection signal for selecting one of the output results of the first band pilot signal and frequency/phase error detecting part and the second band pilot signal and frequency/phase detecting part.

5. The carrier recovery apparatus of claim 4, wherein the comparing part is further for:
   generating the second selection signal for selecting the output result of the first band pilot signal and frequency/phase error detecting part if the new first threshold value is activated earlier than the new second threshold value; and
   generating the second selection signal for selecting the output result of the second band pilot signal and frequency/phase error detecting part if the new second threshold value is activated earlier than the new first threshold value.

* * * * *